United States Patent
Adams et al.

(10) Patent No.: US 7,668,523 B2
(45) Date of Patent: *Feb. 23, 2010

(54) ADAPTIVE AGC IN A WIRELESS NETWORK RECEIVER

(75) Inventors: Andrew R. Adams, Stanmore (AU); Philip J. Ryan, Stanmore (AU); Brian Hart, Wollstonecraft (AU)

(73) Assignee: Cisco Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/672,132

(22) Filed: Feb. 7, 2007

(65) Prior Publication Data
US 2007/0129034 A1 Jun. 7, 2007

Related U.S. Application Data

(63) Continuation of application No. 10/622,175, filed on Jul. 17, 2003, now Pat. No. 7,212,798.

(51) Int. Cl.
H04B 1/16 (2006.01)
(52) U.S. Cl. .................. 455/245.2; 455/251.1; 375/345
(58) Field of Classification Search .............. 455/251.1, 455/232.1, 241.1, 245.1, 245.2, 246.1, 247.1, 455/250.1; 375/345; 330/278
See application file for complete search history.

(56) References Cited

U.S. PATENT DOCUMENTS

| 4,776,040 A | 10/1988 | Ichikawa et al. ............. 455/315 |
| 4,872,206 A | 10/1989 | Graziadei et al. ......... 455/241.1 |

(Continued)

OTHER PUBLICATIONS

Williams, R. "Improving Efficiency When Detecting WLAN Preambles." Nov. 18, 2003. CommsDesign.com. URL: http://www.commsdesign.com/showArticle.jhtml?articleID=16502574.

(Continued)

*Primary Examiner*—Blane J Jackson
(74) *Attorney, Agent, or Firm*—Dov Rosenfeld; Inventek

(57) ABSTRACT

An apparatus, a carrier medium storing instructions to implement a method, and a method for controlling the gain of a radio receiver for receiving packets of information in a wireless network. The receiver is connected to an antenna subsystem and has receive signal path including a plurality of sections including a first section coupled to the antenna subsystem and a next section. Each section has an adjustable gain and is able to provide a measure of the signal strength at its output. The method includes waiting for a start of packet indication, providing a measure of the signal strength at the output of the first section and the next section, and adjusting the gains of the first and the next sections using the provided measured signal strengths. In one embodiment, the receive signal path includes a filter, the provided measure for the first section is before the filter, and the provided measure for the second section is after the filter. The gain adjusting sets first section's gain according to the measured signal strength at the output of the first section and sets the next section's gain according to the provided measure of signal strength at the output of the next section relative to the provided measure of signal strength at the output of the first section. In one embodiment, the gain adjusting o is carried out in sequential AGC stages, one stage setting the gain of one or more sections.

21 Claims, 11 Drawing Sheets

U.S. PATENT DOCUMENTS

| | | | |
|---|---|---|---|
| 5,339,454 A | 8/1994 | Kuo et al. | 455/247.1 |
| 5,564,079 A | 10/1996 | Olsson | 455/54.1 |
| 6,112,095 A | 8/2000 | Wax et al. | 455/456 |
| 6,115,605 A | 9/2000 | Siccardo et al. | 455/426 |
| 6,134,448 A | 10/2000 | Shoji et al. | 455/456 |
| 6,140,964 A | 10/2000 | Sugiura et al. | 342/464 |
| 6,198,935 B1 | 3/2001 | Saha et al. | 455/456 |
| 6,212,391 B1 | 4/2001 | Saleh et al. | 455/456 |
| 6,226,504 B1 * | 5/2001 | Takagi | 455/234.1 |
| 6,249,252 B1 | 6/2001 | Dupray | 342/450 |
| 6,259,406 B1 | 7/2001 | Sugiura et al. | 342/457 |
| 6,269,246 B1 | 7/2001 | Rao et al. | 455/456 |
| 6,275,190 B1 | 8/2001 | Sugiura et al. | 342/464 |
| 6,282,427 B1 | 8/2001 | Larsson et al. | 455/456 |
| 6,304,218 B1 | 10/2001 | Sugiura et al. | 342/464 |
| 6,373,907 B1 | 4/2002 | Katsura et al. | 375/345 |
| 6,414,634 B1 | 7/2002 | Tekinay | 342/453 |
| 6,415,155 B1 | 7/2002 | Koshima et al. | 455/456 |
| 6,441,777 B1 | 8/2002 | McDonald | 342/357.06 |
| 6,442,380 B1 | 8/2002 | Mohindra | 455/234.11 |
| 6,498,927 B2 * | 12/2002 | Kang et al. | 455/245.2 |
| 6,526,283 B1 | 2/2003 | Jang | 455/456 |
| 6,556,942 B1 | 4/2003 | Smith | 702/150 |
| 6,728,524 B2 | 4/2004 | Yamanaka et al. | 455/232.1 |
| 6,927,628 B2 * | 8/2005 | Oshima et al. | 330/133 |
| 6,950,641 B2 | 9/2005 | Gu | 455/241.1 |
| 6,993,291 B2 | 1/2006 | Parssinen et al. | 455/67.11 |
| 2002/0118724 A1 | 8/2002 | Kishimoto et al. | 375/132 |
| 2003/0181184 A1 | 9/2003 | Darabi et al. | 455/293 |
| 2003/0190903 A1 | 10/2003 | Melamed | 455/277.1 |
| 2003/0227986 A1 | 12/2003 | Filipovic | 375/345 |
| 2004/0242177 A1 | 12/2004 | Yang | 455/234.1 |

OTHER PUBLICATIONS

Meng, T. H. "Design and Implementation of an ALL-CMOS 802.11a Wireless LAN Chipset." *IEEE Communications Magazine*, Aug. 2003, pp. 160-168. URL: http://www.ece.utexas.edu/wncg/ee381v/Atheros_OFDM_implementation.pdf.

Van Nee, R., Prasad, R. *OFDM For Wireless Multimedia Communications*. Boston: Artech House, 2000. pp. 246-247.

\* cited by examiner

ADAPTIVE AGC IN A WIRELESS NETWORK RECEIVER

RELATED PATENT APPLICATIONS

The present invention is a continuation of U.S. patent application Ser. No. 10/622,175 to Adams, et al. filed Jul. 17, 2003 now U.S. Pat. No. 7,212,798 and titled ADAPTIVE AGC IN A WIRELESS NETWORK RECEIVER. The contents of such U.S. patent application Ser. No. 10/622,175 are incorporated herein by reference.

BACKGROUND

This invention relates to wireless network receivers, and in particular, to an apparatus and method for setting the gain in a radio receiver to take into account any filtering in the radio receiver signal path. The radio may be the radio of a wireless local area network (WLAN) node such as used in a WLAN that conforms to the IEEE 802.11 standard.

Aspects of the invention are applicable to an RF receiver having an architecture that includes gain control at a plurality of locations in the receive signal path, one or more filters in the signal path, and an analog-to-digital converter to produce digital signals. Thus, aspects of the invention are applicable to a superheterodyne radio receiver, a direct conversion receiver, and to other wireless receiver architectures. The invention, however, will first be explained for a superheterodyne radio receiver.

FIG. 1 shows a typical prior art superheterodyne receiver 100 that includes automatic gain control (AGC). The receive signal path of receiver 100 typically includes a first downconverter 111 to convert the signal at radio frequency to an intermediate frequency (IF) using a signal from a first local oscillator 121, an IF filter 107 in the IF section of the path, and a second downconverter 105 using a signal from a second local oscillator 123 to convert the filtered IF signal at the intermediate frequency to either a baseband signal or a signal at a second intermediate frequency that is close to baseband. Both these cases are called "baseband" herein. The receiver 100 also includes an analog to digital converter to convert the baseband signal to digital signals. These digital signals denoted $Rx_{IN}$ are input to a digital modem part of the receiver (not shown). The receive signal path also includes one or more variable gain amplifiers (VGAs) that are set by an automatic gain control (AGC) system 125 to set the gains of the VGAs according to the strength of the received signal. In this case, the front-end in the RF section is adjustable e.g., using a variable gain low noise amplifier (LNA) 103. In addition, there is an IF variable gain amplifier (VGA) 109 in the IF section of the path, and a baseband VGA 113 in the baseband section of the receive signal path. The signal strength is typically measured at the end of the receive signal path, e.g., at the baseband section by a received signal strength indication (RSSI) detector 117.

Consider prior art receiver 100 and suppose the RSSI indicates a weak signal. The gains—in this case the three gains denoted $Gain_{RF}$, $Gain_{IF}$, and $Gain_{BB}$—need to be set to provide sufficient gain in the front-end for the weak signal, but not too high to ensure that the front-end is not overloaded, which might happen if the signal was received in the presence of a powerful interferer in a nearby channel. The interferer signal is filtered by the filter 109 so does not appear in the RSSI. Thus, the RSSI measure of prior art receiver 100 provides no knowledge of whether or not an interferer was present.

A typical prior art AGC circuit is set assuming worst case scenario. That is, the front-end gain $Gain_{RF}$ is set to accommodate a worse case adjacent channel interferer, even though such an interferer may not be present.

The need to not set the front-end gain too high limits the performance of the receiver. In particular, having a low gain at the front-end increases the noise that accompanies the desired signal.

Thus there is a need for a method to set the gains that provides for determining whether or not an adjacent interferer is present. Thus there also is a need for a receiver that includes an automatic gain control circuit that adapts to the signal condition by using signal strength indications that indicate the strength of the signal of interest compared to the strength of the signal and adjacent interferers.

SUMMARY

Described herein are an apparatus, a carrier medium such as a memory, optical, or magnetic medium storing instructions to implement a method, and a method for controlling the gain of a radio receiver for receiving packets of information in a wireless network. The receiver is connected to an antenna subsystem and has a receive signal path including a plurality of sections including a first section coupled to the antenna subsystem and a next section. Each section has an adjustable gain and is able to provide a measure of the signal strength at its output. The method includes waiting for a start of packet indication, providing a measure of the signal strength at the output of the first section and the next section, and adjusting the gains of the first and the next sections using the provided measured signal strengths. In one embodiment, the receive signal path includes a filter, the provided measure for the first section is before the filter, and the provided measure for the second section is after the filter. In one embodiment, the gain adjusting sets the first section's gain according to the measured signal strength at the output of the first section and sets the next section's gain according to the provided measure of signal strength at the output of the next section relative to the provided measure of signal strength at the output of the first section.

In one embodiment, the gain adjusting is carried out in sequential AGC stages, each stage corresponding to adjusting the gain of one or more sections. For each stage and corresponding sections, the method includes providing measures of the signal strengths at the end of the corresponding sections, comparing the provided measures of signal strength at the end of the corresponding sections to respective desired signal strength levels for the respective corresponding sections, and adjusting the gains of the corresponding sections according to the respective differences between the desired levels and the provided measures of signal strength for the respective corresponding sections to bring the outputs of the sections closer to a desired level.

In one embodiment, each stage finalizes setting of the gain of one corresponding section, and in a particular embodiment, each stage sets the gain of one corresponding section such that the measuring and adjusting of the first and next sections are carried out during a first AGC stage and a second AGC stage, respectively. In such an embodiment, for each stage and corresponding section, the method includes providing a measure of the signal strength at the end of the corresponding section, comparing the provided measure of signal strength at the end of the corresponding section to a desired signal strength level for the section, and adjusting the gain of the corresponding section according to the difference between the desired level and the provided measure of signal strength for the corresponding section.

DETAILED DESCRIPTION

Described herein is a receiver architecture that provides signal strength indication at a plurality of points in the receive signal path, and an AGC method and apparatus that uses the signal strength indications to set the gain of the receiver according to characteristics of the signal.

The receiver is described in the context of variants of the IEEE 802.11 standard for WLANs.

Figure 1:
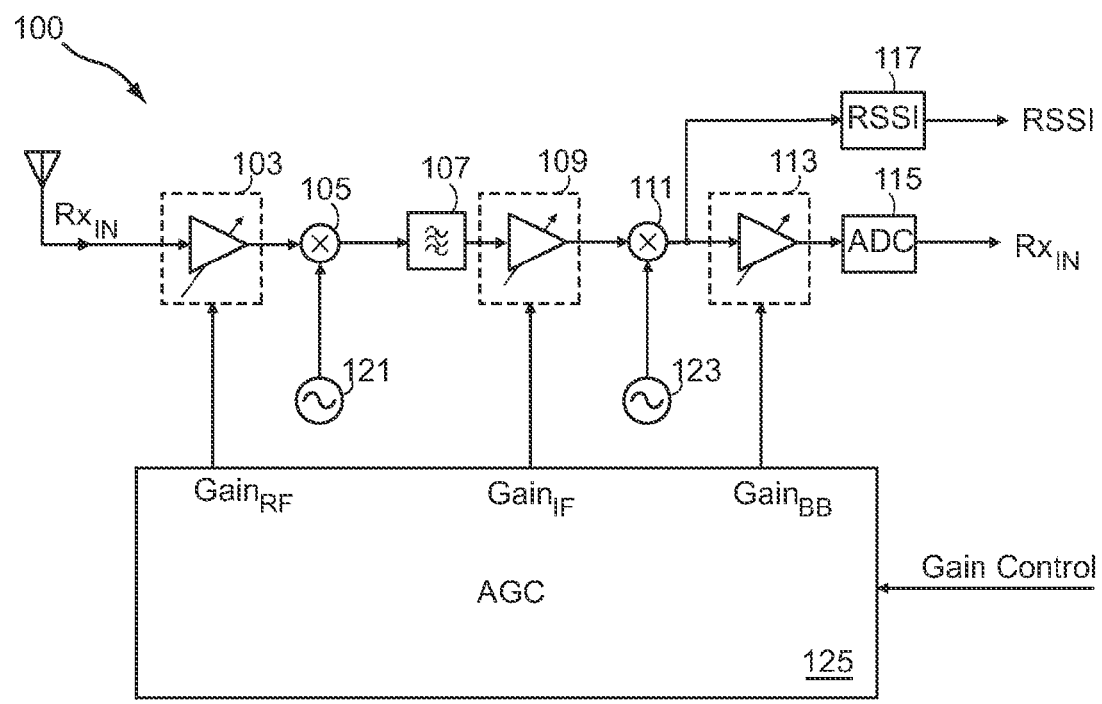
FIG. 1 shows a typical prior art superheterodyne radio receiver that can be used for WLAN applications.
Figure 2:
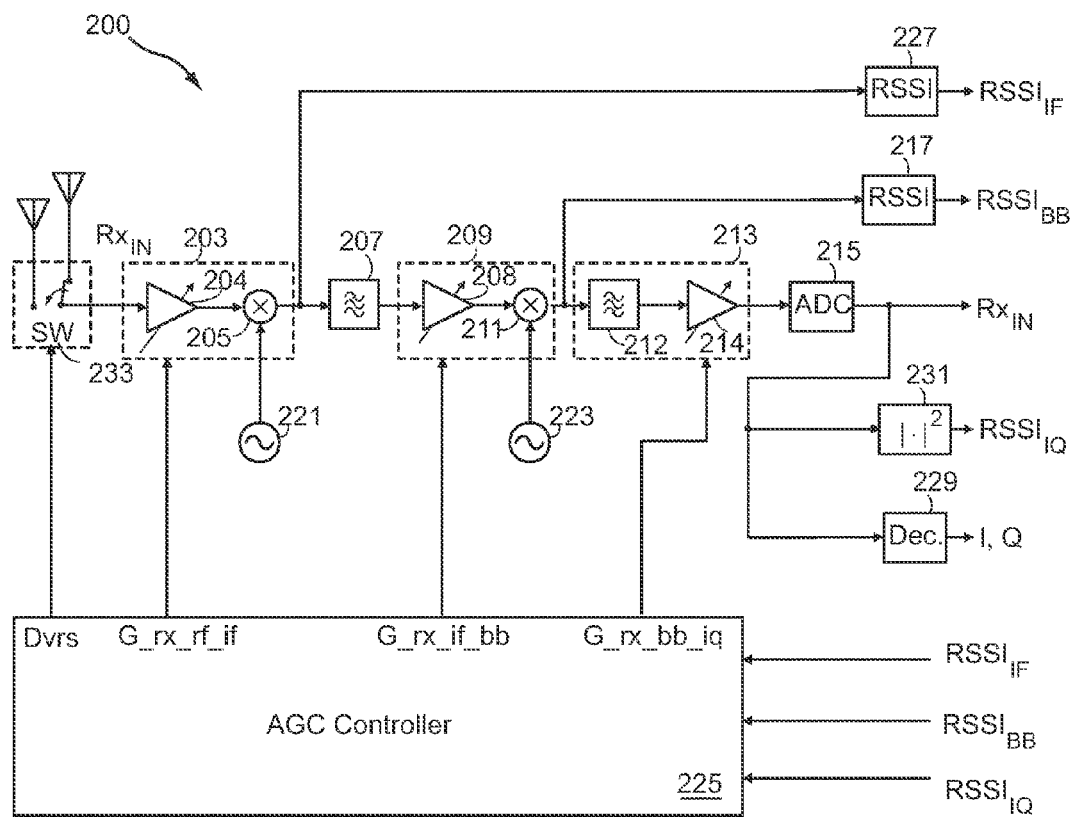
FIG. 2 shows a superheterodyne radio receiver for WLAN applications that includes aspects of the present invention.

FIG. 2 shows a simplified block diagram of a wireless receiver 200 for the physical layer interface (the PHY) of a wireless station of a wireless network. The receiver 200 includes one or more filters in the receive path. In this particular case, the filtering is at the intermediate frequency by filter 207.

An inventive aspect of receiver 200 is that it includes several RSSI indications at different parts of the receive signal path. The signal path includes a plurality of sections whose gains are adjustable, and the RSSI indications are at the end of respective sections. One aspect is that one of the RSSI measures is of the signal prior to any filtering, and that another is post filtering. This provides for a measure of how much filtering occurs, and this is used as an indication of adjacent channel interference.

Thus receiver 200 includes an adjustable front-end section 203 that receives a signal from an antenna subsystem and that in one embodiment includes a variable gain LNA 204 that is controlled by a gain signal. The receiver 200 includes a first downconverter 205 to convert the signal at radio frequency to an intermediate frequency (IF) using a signal from a first local oscillator 221. The front-end section is called the RF-IF section 203, the signal to control the gain of section 203 is denoted G_rx_rf_if, the_rx to indicate it is a receiver gain, and the _rf_if to indicate the RF-IF section. In one embodiment the RF frequency is in the 5 GHz range of the IEEE 802.11a standard, and in another, in the 2.4 GHz range of the IEEE 802.11b and 802.11g standards. Yet another dual frequency embodiment described in more detail below includes two sets of adjustable front-ends, one set for each of the 5 GHz and 2.4 GHz ranges. In one embodiment, the IF frequency is 770 GHz. The receiver 200 further includes an IF filter 207 that in one embodiment is an external surface acoustic wave (SAW) device. There also is an IF VGA 208 in the IF-BB section of the receiver signal path controlled by another gain signal. The receiver signal path also includes a second downconverter 211 accepting the filtered IF signal after the IF VGA 208. The downconverter uses a signal from a second local oscillator 223 to convert the filtered IF signal at the intermediate frequency to either a baseband signal or a signal at a second intermediate frequency that is close to baseband. The term "baseband signal" is used here to denote both cases. A baseband signal at the second IF frequency is assumed, and in one embodiment, this second IF is 20 MHz, and the baseband signal bandwidth is 20 MHz. The section of the receiver between the IF and baseband is denoted the IF-BB section shown as section 209, and the gain of that section is controlled by a gain signal denoted G_rx_if_bb.

The baseband signal is amplified by a baseband VGA 214 whose gain is controlled by yet another gain signal. In one embodiment, the baseband signal is also filtered by a baseband bandpass filter 212 that is shown here preceding the VGA 214, but in another embodiment, may follow the VGA 214. The amplified and filtered baseband signal is input to an analog to digital converter to convert the baseband signal to digitized signals. These digitized signals denoted $Rx_{IN}$ are input to the digital modem of the receiver. The digital modem includes a digital decimator/downconverter 229 that digitally decimates and downconverts the digitized signals to digital I, Q baseband signals denoted I and Q.

The section of the receiver between the second downconverter (to baseband frequency) and the final baseband signal is denoted the BB-IQ section herein, and its gain is controlled by a signal denoted G_rx_bb_iq.

The respective gains of the variable gain elements of the different sections of the receive signal path of receiver 200 are set by an AGC controller 225. AGC controller 225 sets the gains of the variable gain elements according to the strengths of the received signal at various points in the receive signal path.

In one embodiment, receiver 200 includes at least two received signal strength detectors (RSSI detectors) to measure the received signal strength at two or more points in the receive signal path after the different sections that have adjustable gains. The first point for signal strength measurement is after the RF-IF section before the filtering. We call this the pre-filter signal strength measure denoted RSSI-IF in the case the measure is in the IF section, and RSSI-PRE in general. RSSI-IF is measured by an analog RSSI detector 227 in receiver 200 that typically includes a logarithmic amplifier to provide an RSSI measure in a log scale. The second point for signal strength measurement is after the IF-BB section before any baseband variable gain amplification. We call this the baseband signal strength denoted RSSI-BB, and also the post filter signal strength measure, denoted RSSI-POST. RSSI-BB is measured by a second analog RSSI detector 217 in receiver 200 that typically includes a logarithmic amplifier to provide an RSSI measure in a log scale. This detector may be the same as the prior art measuring circuit 117.

In one embodiment, the AGC controller 225 is digital, so it includes an ADC to convert the analog RSSI-IF and analog RSSI-BB measurements to digital measurements, and a corrector/averager to average the digitized measures. Because the log-amplifiers in the two RSSI detectors typically have different slope and different intercepts, in one embodiment, the averager includes correction for the different slopes of the different log-amplifiers in the two RSSI detectors prior to averaging, and correction for the current gain settings post averaging, so that the measures may be compared. Other corrections also may be included in different embodiments, e.g., temperature correction. The corrected average d values are denoted RSSI-IF_dBm and RSSI-BB_dBm, respectively, are in a scale so that they may be compared.

Comparing RSSI-IF_dBm with RSSI-BB_dBm provides an indication of the signal strength at the front-end compared to the post-filter signal strength so that the value of the corrected average RSSI-IF relative to the corrected average RSSI-BB, e.g., the difference between RSSI-IF_dBm and RSSI-BB_dBm when both are in a logarithmic scale (dBm, etc.) provides an indication of how much attenuation is caused by the IF filter. This in turn provides an indication of how much out-of-band interference there is in the signal.

In one embodiment in which baseband filtering is included in the BB-IQ section, a third measure of signal strength is used of the quadrature digital signals I, Q after digitization and downconversion/decimation. This measure is obtained digitally by a digital RSSI measuring logic circuit 231 that determines the signal power, denoted RSSI-IQ from the sampled I, Q signals. In one embodiment, the digital RSSI measurer 231 uses the input directly from the ADC 215, while in another, it is coupled to the output of the decimator/downconverter 229 to use the downconverted I, Q samples. In one embodiment, the AGC controller 225 also includes a lookup averaging circuit and a linear-to-log converter for the RSSI-IQ measure to produce a average measure, and this is followed by a correction for the present gain setting so that the results can be compared to the RSSI-IF_dBm and RSSI-BB_dBm measures. The result is denoted RSSI-IQ_dBm. The difference between RSSI-BB_dBm and RSSI-IQ_dBm when both are in the same logarithmic scale is a measure of the amount of filtering provided by any baseband filtering in the BB-IQ section, e.g., by filter 212 of the baseband signals prior to the analog-to-signal conversion. The additional information can be used to better distribute the individual variable gain element gain settings that make up the overall gain of the receive signal path according to the properties of the signal at various points in the receive signal path.

The embodiment shown in FIG. 2 includes antenna diversity. Two receive antennas are coupled to the RF input terminal of the receiver via a diversity switch 233. Another aspect of the invention is the use of the AGC controller and the RSSI signals to determine which antenna to use for reception. This is discussed further below.

Thus, the receive signal path includes an adjustable pre-filter section (the front-end) and at least one post-filter variable gain element.

The information provided by the two or more RSSI signals provides for better adjustment of the multiple gains in the receive signal path based on the calculated attenuation of out-of-band energy.

For example, in the case that the receiver 200 receives a weak signal in the presence of a large neighboring channel interference, there will be a significant difference between the RSSI-IF_dBm and the RSSI-BB_dBm, and as a result, the gain of the front-end VGA 203 may be reduced to accommodate the strong input, while the post-filter VGA(s) gain(s) may be turned up to amplify the in-band signal post filtering. On the other hand, if a weak signal is received with no significant interference, there will be no significant difference between RSSI-IF_dBm and RSSI-BB_dBm, and as a result, the gain of the RF-IF section 207 may be turned up. This provides better signal-to-noise performance. Thus the range is improved, e.g., in a strong signal environment.

In one implementation, the front-end gain G_rx_rf_if is set according to the difference between RSSI-IF_dBm and RSSI-BB_dBm. The more the difference, the lower the front-end gain threshold.

Note that even when no filter such as filter 212 is included in the baseband part, the AGC method may still include three measurement stages. The first two are based RSSI-IF_dBm and RSSI-BB_dBm. These two stages adjust the front-end section, and "coarsely" adjust the remainder of the receive signal path to bring the output to within range of the ADC 215 that provides finer sampling than provided by the analog RSSI circuits. The third gain adjustment stage then provides finer control of the overall gain of the receive signal path.

While one embodiment provides AGC in a superheterodyne receiver, aspects of the invention are also applicable to other receiver architectures. The invention is particularly applicable to a direct conversion architecture where the baseband mixers and filters typically have relatively high noise figures, so that it is important to be able to keep the front-end gain high for all receive scenarios.

Figure 3:
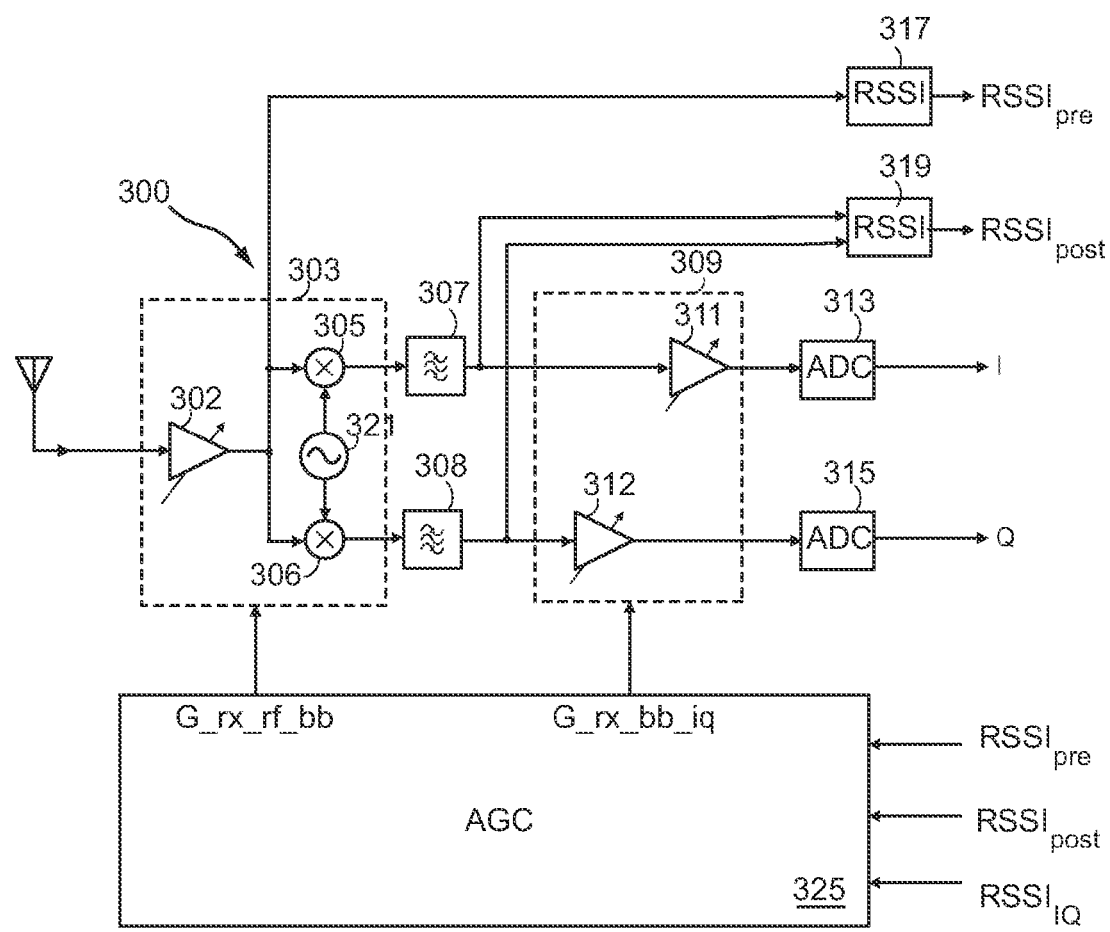
FIG. 3 shows a direct conversion radio receiver for WLAN applications that includes aspects of the present invention.

FIG. 3 shows a receiver 300 that has a direct conversion architecture. The receive chain includes a single RF section for single frequency range followed by a pair of downconverters that directly generate I and Q baseband signals. A single frequency RF section is shown in FIG. 3, and how to modify receiver 300 to include more that one RF section to accommodate more than one frequency range would be clear to those in the art.

The front-end section 303 has a variable gain, and in particular, the RF section includes variable gain elements shown as a single VGA 302. Two downconverters 305, 306 are driven by the quadrature components of a local oscillator 321 to generate I and Q baseband signals, respectively. The front-end section, shown including the downconverters, is called the RF-BB section 303 and has a gain controlled by a signal denoted G_rx_rf_bb.

A pair of filters 307, 308 for the I, Q signals, respectively, follows the RF-BB section 303. The remainder of the receiver forms the baseband, also called post-filter section, denoted the BB-IQ section 309, and includes a pair of variable gain amplifiers 311, 312 to amplify the I, Q signals and a pair of analog-to-digital-converters 313, 314 convert the amplified I, Q signals for the I and Q signal paths into digital signals for use by the digital modem (not shown) part of the PHY. The baseband section 309 thus has an adjustable gain controlled by a signal denoted G_rx_bb_iq.

A measure of the pre-filter signal strength denoted RSSI-PRE is obtained by the signal strength detector 317 that in one embodiment includes a logarithmic amplifier. A measure of the post-filter signal strength denoted RSSI-POST is obtained by the signal strength detector 319 that determines the signal strength of the combined I and Q parts of the receive signal. In one embodiment, the signal strength detector 319 includes a logarithmic amplifier.

An AGC controller 325 includes averaging/correction circuits for the pre and post RSSI signals to produce corrected averaged signals, denoted RSSI-POST_dBm and RSSI-PRE_dBm, respectively, that are in the same logarithmic scale and that are corrected for the differences in the RSSI detectors. The difference between RSSI-POST_dBm and RSSI-PRE_dBm is an indication of the amount of filtering carried out by the filters 307 and 308, and thus an indication of the amount of interference. This is used by the AGC controller 325 to set the variable front-end 303 to the most appropriate gain setting according to the pre-filter measure of signal strength and the remaining variable gain elements in the baseband section to achieve a desired overall gain.

Thus, one embodiment of an AGC controller operates for either a superheterodyne or a direct conversion receiver and sets the gain of the first—the pre-filter—section that is coupled to the antenna subsystem according to the measure of the pre-filter signal strength, and sets the gain of the next—the post filter—section according to the measure of the post-filter signal strength relative to the pre-filter signal strength, e.g., the difference of the pre and post-filter strengths when both are in a logarithmic scale. These two sections' gains may be set simultaneously, and bring the output into the range of the analog-to-digital converter or converters. If there is a third section, the gain of the third section may now be set according to the signal strength measure obtained from the samples after analog-to-digital conversion.

Note that the application is wireless networks that communicate data in packets. Prior to the setting of the gain according to the signal strengths, the gains are set to a default value such that packets with a wide range of powers may be detected. A start of packet detector detects the start of packet. Following that detection, the AGC controller sets the gain as described herein.

Figure 4:
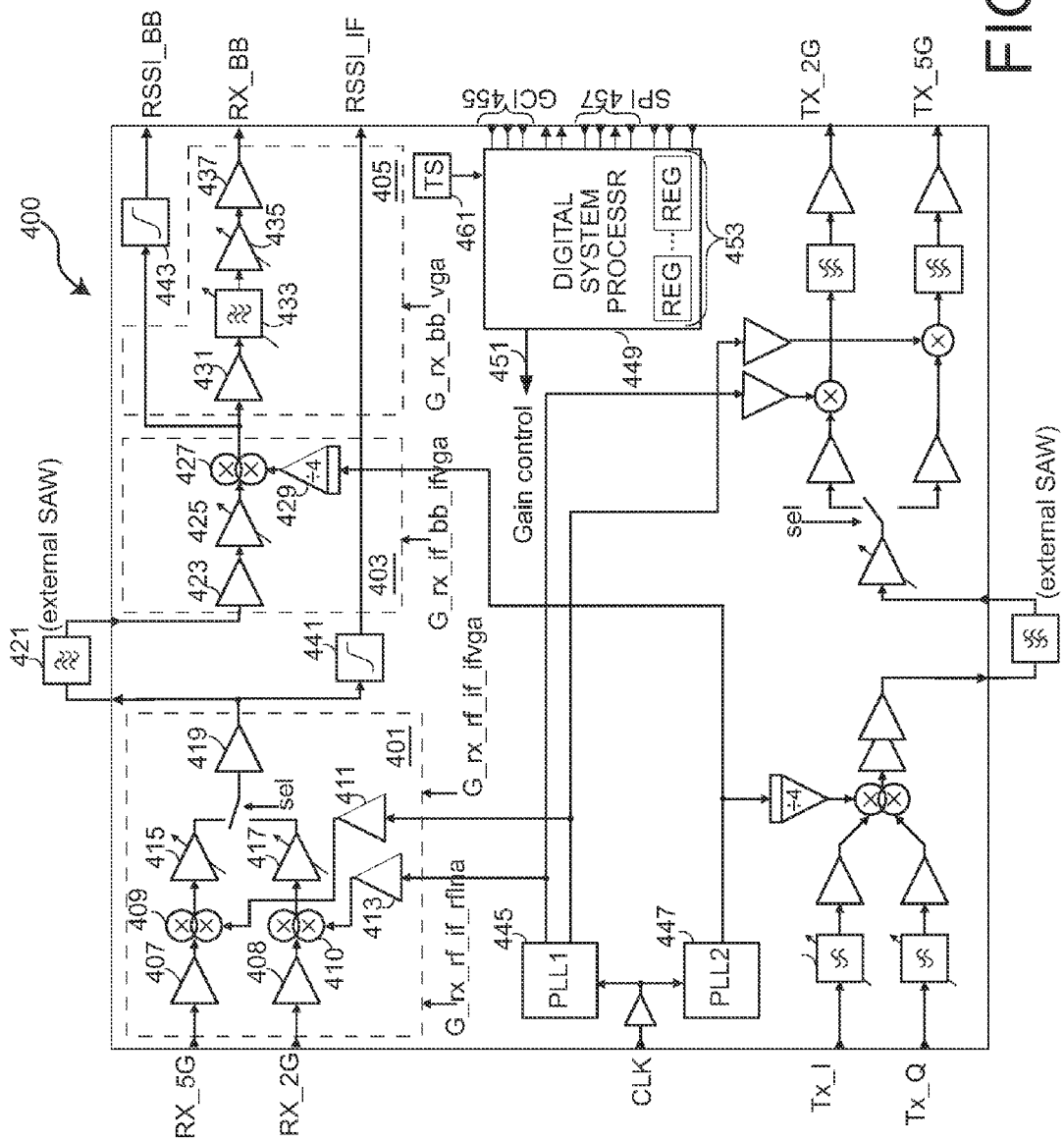
FIG. 4 shows in a simplified block diagram an embodiment of a radio transceiver 400 that operates with a modem and a MAC processor for use in a wireless station that conforms to the 802.11a,b,g variants of the IEEE 802.11 standard.

FIG. 4 shows a simplified block diagram of an embodiment of a radio transceiver integrated circuit 400 that operates with a modem and a MAC processor for use in a wireless station that conforms to the 802.11a,b,g variants of the IEEE 802.11 standard. Only the receiver part is described in detail herein, and many details unrelated to gain control are omitted. The 2.4 GHz and approximately 5 GHz inputs to the receiver subsystem drive differential-input RF low-noise amplifiers (LNAs) 407 and 408, respectively. In one embodiment, the LNAs 407 and 408 have a settable gain, e.g., by bypassing or not the LNAs. The LNAs 407 and 408 each feed the RF input of two downconverters, 409 and 410, respectively. The oscillator signal from a synthesizer denoted PLL1 445 is buffered by buffer amplifiers 411 and 413, respectively before being fed to the oscillator inputs of the RF downconverters 409 and 410, respectively. In one embodiment, each of the RF downconverter 409 and 410 contains a relatively highly linear double-balanced mixer, a filter and an IF output preamplifier. The outputs of downconverters 409 and 410 are fed to a pair of IF variable gain amplifiers 415, 417 and then via a switch to the input an IF output buffer 419. The switch selects the frequency range between the 5 GHz and 2.4 GHz ranges under control of a control signal set.

The LNAs 407 and 408, and the IF VGAs 415 and 417 together provide a variable gain for a RF-IF section 401. The LNAs 407 and 408 are under control of gain control signal $G\_rx\_rf\_if\_lna$ and the IF VGAs 415 and 417 under control of a signal denoted $G\_rx\_if\_if\_ifvga$. The AGC system described herein controls the gains of LNAs 407 and 408 to control the overall RF-IF section's gain by controlling particular gain control bits of a gain control word.

The buffer 419 drives an external IF filter 421. In one embodiment used with a fixed intermediate frequency 770 GHz, for relatively high performance applications, the external IF filter 421 is a surface acoustic wave device. In other less-demanding applications, a relatively simple LC filter may be used for IF filter 421.

The output of the external IF filter 421 feeds an IF low noise amplifier 423 that in turn feeds a second IF VGA 425, whose gain is adjustable by a digital signal denoted $G\_rx\_if\_b\_b\_ifvga$. The IF VGA 425 feeds the IF input of a downconverter 427. The quadrature oscillator signal for the down converter 427—in one embodiment, 750 GHz—is generated by a quadrature signal generator 429 by dividing the output of a second synthesizer denoted PLL2 447—3.00 GHz in one embodiment—by four. In one embodiment, the IF downconverter 427 contains a quadrature mixer that generates a single in-phase baseband IF signal of 20 MHz bandwidth centered on 20 MHz. The IF buffer 423, VGA 425 and downconverter 427 form a IF-BB section 403 of the receive signal path. The gain of section 403 is controlled by $G\_rx\_if\_bb\_ifvga$, e.g., by particular gain control bits of the gain control word.

The IF downconverter 427 outputs feeds a buffer amplifier 431 that drives a bandpass filter 433 (10-30 MHz in one embodiment). The filter 433 is tunable, and in one embodiment, bypassable. The output of the filter 433 drives a baseband VGA 435 whose gain is adjustable by a digital signal $G\_rx\_bb\_vga$. The baseband VGA 435 output drives a buffer 437. The output of the buffer amplifier is converted to digital samples via an analog-to-digital converter (not shown) and these samples are then processed by a modem (also not shown) to demodulate and otherwise process the samples for complete 802.11 physical layer (PHY) processing. The buffer 431, filter 433, VGA 435 and buffer 437 form the baseband (BB-IQ) section 405 of the receive path whose gain is controlled by digital signal $G\_rx\_bb\_vga$, e.g., by particular gain control bits of the gain control word.

In one embodiment in which the IF is 770 GHz, the PLL1 frequency ranges are 3.17-3.27 GHz for the 2.4 GHz mixers and 4.41-4.55 GHz, or 6.27-6.47 GHz for the approximately 5 GHz RF mixers depending on whether the frequency band is IEEE 802.11a or HiperLAN-compatible.

The operation of the transceiver 400 controlled by digital system processor 449. Processor 449 is a digital circuit that includes one or more—say N—registers 453, and a system processor interface (transceiver SPI) 457. The transceiver SPI, also referred to as the transceiver configuration port, provides access to the registers 453, and in one embodiment, is a serial port. In one embodiment, a microcontroller also is included A transceiver gain control interface (transceiver GCI) 455 accepts gain parameters—the respective gain control bits of the gain control word-for the digital system processor 449 that in turn causes the gain control. In one embodiment, the gain control interface 455 is a serial receive-only port for setting gains, used by the receive path automatic gain control logic in a radio controller (a modem—see FIG. 5) to dynamically adjust transceiver receive path gain in order to optimize the received signal to noise ratio. In an alternate embodiment, a parallel interface is used for gain control. The GCI 455 also provides a mechanism for controlling the transceiver transmit power level by selecting from one of nine configurations for the power amplifier in the transceiver.

The GCI data is loaded into one of three further registers included in the transceiver: the GCI receiver register, the GCI transmitter gain register, or the GCI PA mode register. These registers control the variable gain blocks in the transmit and receive paths, respectively, when a GCI enable bit is set. Otherwise, the registers set the signal path gains.

A gain control bus 451 is used to communicate control signals, e.g., the sets of gain control bits from the registers in register set 453 in the digital system processor 449 to various subcircuits of the transceiver for the purpose of setting several characteristics of the transceiver. The control bus is used, for example, to set the gains of the sections 401, 403, and 405 of the receive signal path. The control bus is also used to send signals from the system processor to set the gains of transmitter amplifiers and the power amplifiers in the transmit signal path. Furthermore, the control bus 451 is also used to send signals from the system processor to set the characteristics of the filters 433 on the receiver side and filters on the transmitter side.

According to one embodiment, the microcontroller of processor 449 includes a RAM for instructions, a RAM for data, and a ROM for instructions.

Radio transceiver 400 is substantially monolithic, i.e., a single chip and in one embodiment, includes metal oxide semiconductor (MOS) circuitry, including CMOS analog and digital circuitry.

Figure 5:
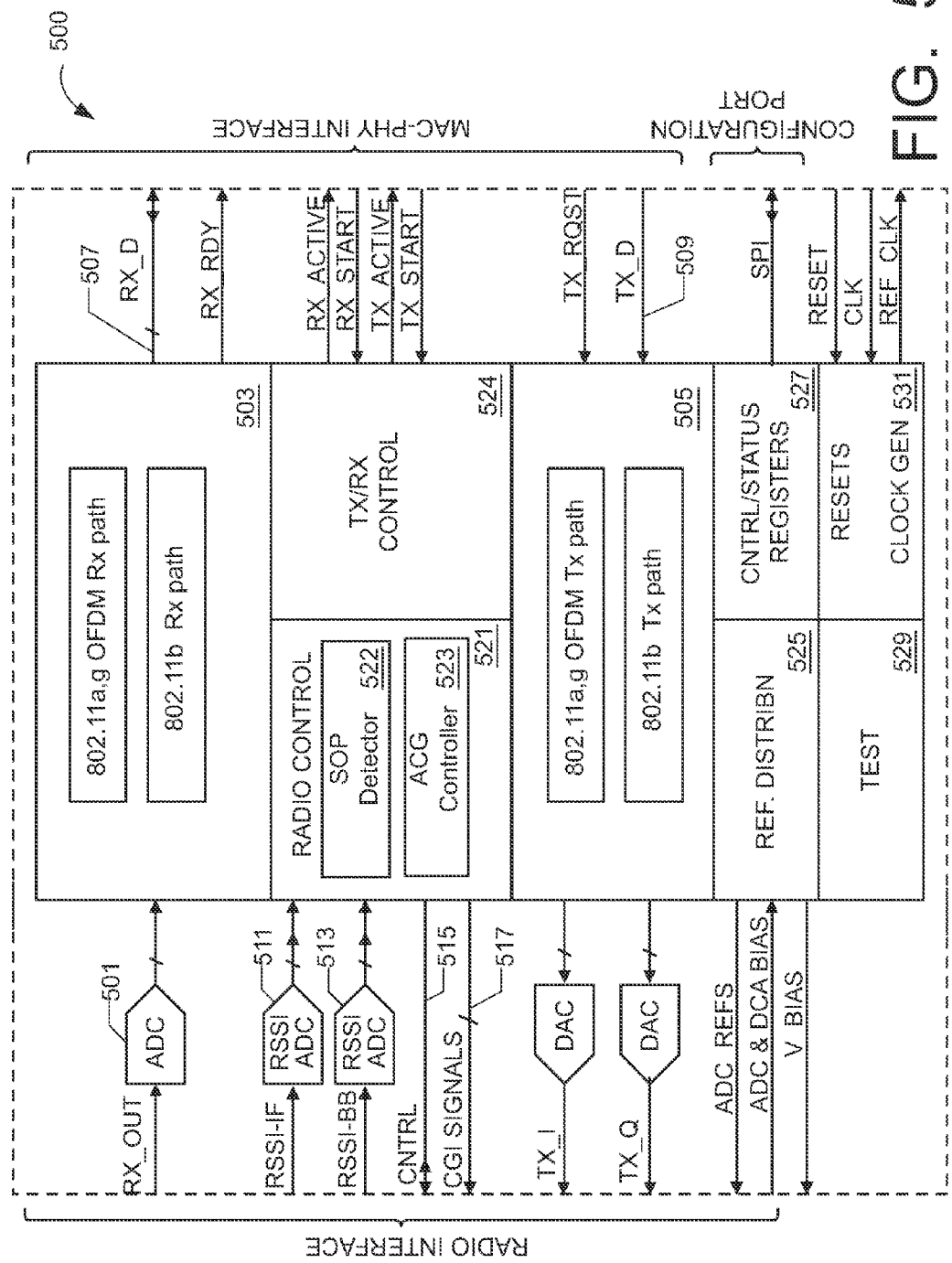
FIG. 5 shows in a simplified block diagram an embodiment of a modem chip 500 that operates with a transceiver such as shown in FIG. 4 and a MAC processor for use in a wireless station that conforms to the 802.11a,b,g variants of the IEEE 802.11 standard. The modem 500 includes an embodiment of an AGC controller that operates according to one or more aspects of the present invention.

The transceiver 400 is designed to be used with a modem chip that acts as an interface between the transceiver 400 and a MAC processor. FIG. 5 shows in simplified block diagram form, an embodiment 500 of a modem that is implemented as a single chip, that can operate with the transceiver chip 400 and a MAC processor, and that implements the AGC method described herein. An ADC 501 accepts a differential analog signal from the transceiver chip 400. The receive signal processor 503 accepts the digitized receive signals from the ADC 501 and carries out the operations needed to demodulate signals that conform to the OFDM 802.11a or 802.11g variants of the IEEE 802.11 standard, or to the DSSS/CCK 802.11b variant of the IEEE 802.11 standard. Thus, the receive signal processor 503 includes an IEEE 802.11a,g compliant receive signal processor and an 802.11b-compliant receive signal processor. The output 507 if the receive processor 503 is coupled to an off-chip MAC processor.

The analog input from the transceiver chip is sampled at 80 Ms/s by the ADC 501 and an internal IQ down-converter in processor 503 generates baseband I and Q channel outputs.

A to-be-transmitted signal 509 from the MAC is input to a transmit signal processor 505 that performs modulation and other signal processing to provide digital I and Q digital signals that are converted to analog I- and Q-signals by a pair of digital-to-analog converters. These analog signals are input to the transmitter input of transceiver chip 400. Thus, the transmit signal processor 505 includes an IEEE 802.11a,g compliant transmit signal processor and an 802.11b-compliant transmit signal processor.

In one embodiment, operation of the modem 500 is controlled and monitored by a set of control and status registers that, in one embodiment, are 16-bits each and accessed via Serial Peripheral Interface (modem SPI). Some of the registers are usable as memory.

The radio receiver is controlled by radio control block 521 that includes a start-of-packet (SOP) detector 522 and the inventive automatic gain control (AGC) controller 523 for dynamically setting the gains and the performance of the transceiver. The receive and transmit functions of the modem are controlled by a TX/RX control block 524 that both provides controlling the function of the modem under control of the off-chip MAC controller and that provides status signals to the off-chip MAC controller.

The modem also includes a modem gain control interface (modem GCI) in radio control 521 that outputs gain parameters, e.g., in the form of sets of gain control bits to a radio receiver such as transceiver 400. The gain control interface is a serial transmit-only port for setting gains, used, for example to dynamically adjust transceiver receive path gains as described herein. In one embodiment, the GCI also provides a mechanism for controlling the transmit power level of a radio transmitter connected to the modem by selecting from one of nine configurations for the power amplifier of the transmitter. One embodiment of the radio transceiver also includes a transceiver gain control interface (transceiver GCI).

The modem 500 also includes a pair of analog to digital converters 511 and 513 to convert the analog RSSI-IF and RSSI-BB values to digital signals for the radio control section 521 that implements AGC and SOP. The AGC controller 523 in section 521 uses a finite state machine (FSM). In an alternate embodiment, a microcontroller also is included.

The modem 500 also includes a reference distribution subsection 525 to provide various reference currents and voltages to the converters, a test subsection 529, and a reset/clock generation subsystem.

Figure 6:
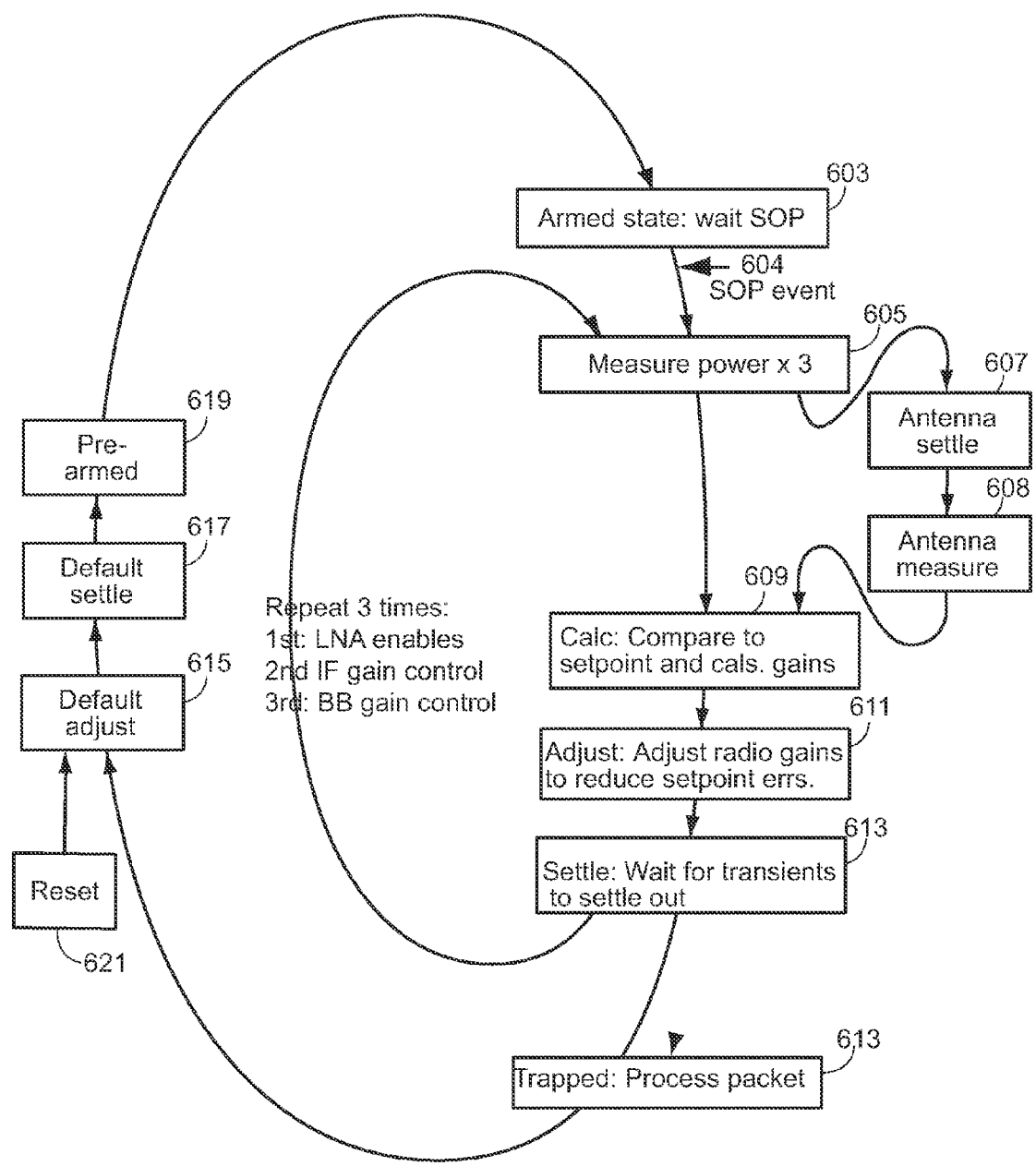
FIG. 6 shows a state-transition diagram that describes the operation of a finite state machine implementing an embodiment of an AGC controller that includes one or more aspects of the invention.

While one embodiment of an AGC controller operates to first simultaneously set the gains of the first and next sections of the receive signal path, and then sets the gain of the final section, the one embodiment of AGC controller 523 operates in stages, with each stage having corresponding sections whose gain settings are finalized at that stage. In one embodiment, each stage finalizes one sections gain setting, and in general, each stage sets more than one section's gains. Such operation of the AGC controller 523 is now described in detail. FIG. 6 shows a state-transition diagram that describes the operation of the FSM of AGC controller 523. No antenna diversity is first assumed. The case of diversity selection is discussed in more detail below.

Initially, the AGC controller 523 sets a default gain and in an Armed state 603 (a wait state) waits for a packet to arrive, as signaled by a start-of-packet (SOP) event 604 detected by the start-of-packet detector 522 in radio controller 521. The default gain setting sets the gains of each section to allow packets having a broad range of signal strengths to be detected reliably. Depending on the SOP detection method, the SOP event nominally occurs during the first 1.6 µs of an OFDM packet, or 4 µs of a DSSS/CCK packet. After a packet is detected, the AGC controller 523 in a state 605 called the Measure state measures the received signal strength in the radio at three points in the receive signal path at different stages, e.g., different repetitions of the measure state 605. In a state 609 called the Calc state, the AGC controller 523 compares the respective received signal strength measurement to its respective setpoint. Based on the comparison, the AGC controller 523 calculates improved radio gain control bits to send to the transceiver 400 so as to reduce the setpoint errors. In a state called the Adjust state 611, the AGC controller 523 updates the radio 400 with the improved gain control bits via the GCI. After the radio is commanded to change its gain, there may be a transient. There also is typically a delay before the new gain is fully reflected in the outputs, e.g., the ADC output. In a wait state 611 called the Settle state, the AGC controller waits for transients to settle out and for the outputs to reflect the new gain settings.

The Measure, Calc, Adjust, and Settle states 605, 609, 611, and 613 form a sequence of steps we call an AGC stage herein. These states are repeated, e.g., three times for the different RSSI measurements. The amount of time for each AGC stage is settable, and in one embodiment applicable to the IEEE 802.11 standard is typically approximately 0.3 to 2 μs, i.e., less than about 6 ps for all three stages. In one particular embodiment, each AGC stage is set to take nominally about 1 ps so that the total duration of these AGC stages is nominally about 3 μs. The AGC controller uses a stage counter to count which stage it is in. The stage counter is incremented at the end of each stage.

Note that while one embodiment has three stages, the AGC controller has many configuration parameters and can be reconfigured to make more or fewer measurements, e.g., fewer or more stages, and also carry out AGC in a different amount of time, and to update one or more sections per AGC stage.

Once the three gain setting stages are completed, the AGC controller moves to a state called the Trapped state 613 in which the radio gain is fixed for the remainder of the packet.

At the end of the packet, or upon an early abort, or after an initial reset state 621, in a stage called the Default adjust state 615, the AGC controller 523 reloads the radio gain with its default value. The AGC controller then moves to a wait state called the Default settle state to wait for the default gain settings to be reflected in the outputs of the sections of the radio. In another wait state called the Pre-armed state 619 in which it is inappropriate to detect a new packet, the AGC controller waits to move to the armed state. Reasons for being in the Pre-armed state 619 include that the modem may be performing other tasks, e.g., finishing to process the last packet, or transmitting a packet. After the Pre-armed state, the AGC controller moves to the Armed state to wait for a packet.

Figure 7:
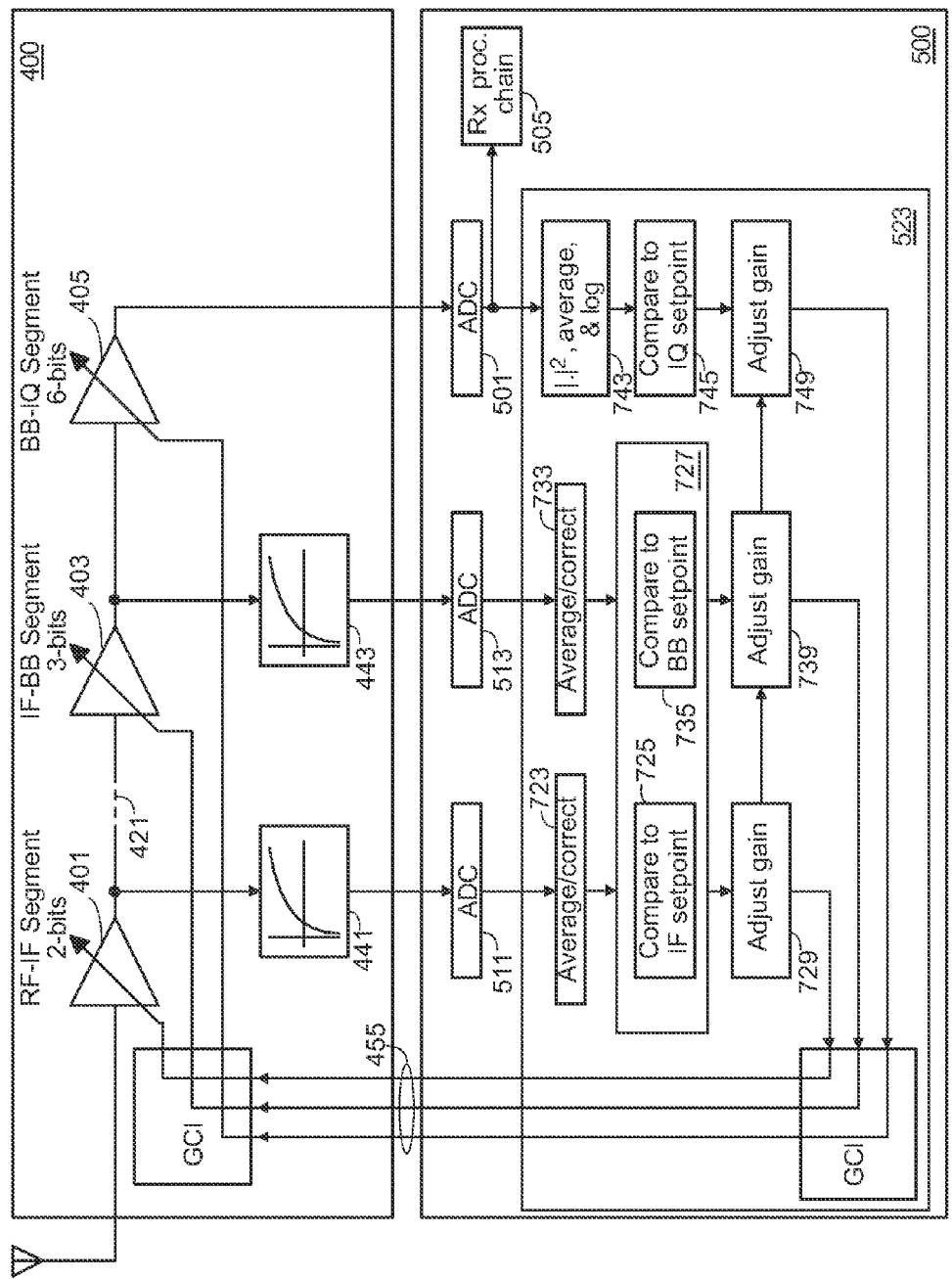
FIG. 7 shows in a simplified block diagram how an AGC controller embodiment takes the measured RSSI values and calculates improved gain control bits for a receiver embodiment, shown here as three sections with adjustable gain and split by where the RSSI signals are tapped off.

For each AGC stage, the AGC controller 523 takes the measured RSSI values and calculates improved gain control bits for the radio. For this, the AGC controller 523 models the radio receiver 400 as three sections, split by where the RSSI signals are tapped off, as shown in FIG. 7 which shows some the elements of transceiver 400 (FIG. 4) and modem 500 (FIG. 5) in simplified form. FIG. 7 does not show the registers or other forms of memory in modem 500. The receive signal path sections are the RF-IF section 401, i.e. antenna output to RSSI-IF input section, the IF-BB section 403, i.e. RSSI-IF input to RSSI-BB input, and the BB-IQ section 405, i.e. RSSI-BB input to radio receiver output section. The RF LNA and first IF VGA control bits reside in the RF-IF section, the IF-BB section contains 3 IF gain control bits, and the BB-IQ section is controlled by 6 fine gain control bits.

Each receive signal path section has a particular output signal level that maximizes signal-to-noise-and-distortion (SINAD). Although the AGC controller 523 cannot measure this internal level directly, it can monitor the RSSI signal from the end of the section, and this has an equivalent desired level. Furthermore, the SINAD degrades whenever the signal or RSSI level departs from its respective desired level called a setpoint herein.

Therefore the task of AGC controller 523 is to adjust the gain of each receive path section by turning gain control bits on and off within each receive path section in order to bring the RSSI at the end of the section close to its desired level (the setpoint), as shown in FIG. 7.

In one embodiment, the RSSI-IF detector 441 and the RSSI-BB detectors are each capable to detection to within half a dB. The AGC part for the RF-IF and IF-BB sections 401, 403 includes the RSSI-IF detector 441, the RSSI-BB detector 443, the RSSI-IF ADC 511, the RSSI-BB ADC 513, an averager/corrector 723 to produce an averaged/corrected measure denoted rssi_if_hdB, an averager/corrector 733 to produce a averaged/corrected measure denoted rssi_bb_hdB, and an element 727 to further correct the measures for the present gain settings and other effects, and also to change one or more of the RF-IF and IF-BB sections' setpoints to account for the amount of filtering between the measurement points, e.g., as a measure of the amount of adjacent channel interference. Element 727 includes a setpoint comparison elements 725 and 735 to compare the corrected averaged IF and BB RSSI measures of signal strength to the respective adjusted setpoints. The outputs of element 727 are accepted by gain adjustment elements 729 and 739, respectively, that provides a first set of gain control bits.

Each of averagers/correctors 723 and 733 includes a lookup table to correct for slope, intercept, and any non-linearities in the signal strength measurements.

One aspect of the invention is that the IF and BB indications of signal strength are on a scale and calibrated such that they may be compared. In particular, when the measures are in a log scale, their difference provides a measure of how much filtering is carried out between the measurement points. This may indicate, for example, the amount of adjacent channel interference. In one embodiment, element 727 includes determining the corrected measures RSSI-IF_dBm and RSSI-BB-dBm as follows:

$$RSSI\text{-}IF\_dBm = \begin{array}{l} rssi\_if\_hdB/2 - rf\_if\_gain\_hdB/2 - \\ rssi\_if\_tempco * tempmeas/2 - \\ c\_agc\_offset\_if\_dBm. \end{array}$$

$$RSSI\text{-}IF\_dBm = \begin{array}{l} rssi\_bb\_hdB/2 - rf\_bb\_gain\_hdB/2 - \\ rssi\_bb\_tempco * tempmeas/2 - \\ c\_agc\_offset\_bb\_dBm. \end{array}$$

The first term in each expression is the averaged and corrected IF and BB RSSI values from averagers/correctors 723 and 733, denoted rssi_if_hdB and rssi_bb_hdBm respectively, The second term in each expression subtracts the "existing gain" for the respective RF-IF and IF-BB sections. These are mapped from the gain control bits. In one embodiment, the relationship of gain control bits to gain is implemented by an "Offset Table" whose input is the AGC controller 523's record of the radio's current gain control bits, and its output is the current radio gain due to these gain control bits.

In particular, rf_if_gain_hdB=rf_if_offset-table(current_gcbs) and if bb_gain_hdB=rf_if_offset_table(current_gcbs)+if_bb_offset table(current_gcbs), where current_gcbs denotes the current gain control bits, rf_if_offset_table(·) denotes the Offset Table for the RF-IF section, and if_bb_offset table(·) denotes the Offset Table for the RF-IF section.

The third term is each expression compensates for the temperature. The inventors discovered that this term is less important than some of the others, and thus, simplified embodiments do not include temperature compensation. The embodiment that includes temperature compensation operates with a transceiver chip 400 that includes an on-chip temperature sensor 461 (see FIG. 4) and an ADC (not shown in FIG. 4) that provides a measure of the temperature. The modem 500 has access to this measurement, denoted tempmeas, in digital form. rssi_if_tempco and rssi_bb_tempco are stored parameters for the temperature correction.

The last of each of the expressions is a conversion term that further corrects for linearity when converting to dBm.

The multiplies and divides by two are to change to and from half dB units, respectively.

One aspect if the invention is that the adjusting of the desired levels—the setpoints—of the outputs of the respective pre-filer and post-filter sections uses the pre-filter and the post-filter RSSI measures to account for the amount of filtering, e.g., to account for the amount of adjacent channel interference.

We define the headroom, denoted by headroom_dB, in dB, as the difference between the measure of the output of the first, RF-IF section and a maximum input power as follows:

headroom_db=max(c_agc_rssi_if_max_dBm-RSSI_IF_dBm, 0), where c_agc_rssi_if_max_dBm denotes a settable max input power above which the setpoint is not adjusted according to one aspect of the invention.

The amount of filtering, i.e., the amount of adjacent channel interference, denoted ACI, is the difference between the measures at the outputs of the pre and post filter sections. When expressed in dB, the ACI, denoted ACI_dB, is:

ACI_dB=max(RSSI_IF_dBm_RSSI_BB_dBm, 0)

In one embodiment, pre-filter (RF-IF) section's setpoint is changed according to the amount of determined ACI. In particular, it is increased by the determined ACI. This determined adjacent channel interference is first adjusted so that the setpoint adjustment according to the detemined ACI does not cause the input power to exceed the allowable maximum input power c_agc_rssi_if_max_dBm.

Denoting the settable setpoint of the RF-IF section by c_agc_setpoint_if_hdB (in half-dB units), the adjusted setpoint denoted agc_setpoint rssi_if aci_hdB is agc_setpoint_rssi_if_aci_hdb=c_agc_setpoint_rssi_if hdB+2*min_aci_headroom_dB, where min_aci_headroom_dB=min(aci_dB, headroom_dB)

is the determined ACI adjusted as necessary so that the input power does not exceed the settable maximum.

Thus, If the corrected RSSI-IF_dBm is above the adjusted IF setpoint, the gain adjustment circuit 729 reduces the radio gain by the difference; otherwise the gain adjustment circuit 729 increases the gain by the difference. If the corrected RSSI-BB_dBm is above the BB-IQ setpoint, the gain adjustment circuit 739 reduces the radio gain by the difference; otherwise the gain adjustment circuit 739 increases the gain by the difference.

The AGC part for the BB-IQ section 405 includes the ADC 501, a processor 743 to average, calculate the magnitude-squared convert linear-to-log to produce RSSI-IQ_dBm, a compare-to-IQ-setpoint circuit 745 and a gain adjustment circuit 749 that provides a third set of gain control bits. If RSSI-IQ_dBm is above the IQ setpoint, the gain adjustment circuit 739 reduces the radio gain by the difference; otherwise the gain adjustment circuit 739 increases the gain by the difference.

The compare-to-setpoint logic circuits 725, 735, and 745 each compute a respective setpoint error as the corrected/averaged RSSI measure minus its setpoint, where all power quantities are in 0.5 dB steps. Each of the gain adjust logic circuits 729, 739, and 749 respectively determine a "requested gain" as the "existing gain," produced by the current gain control bits, minus the setpoint error from the respective compare-to-setpoint logic circuits. If the radio could supply this requested gain, the setpoint error would be reduced to zero. However, the radio implements discrete gain steps, so the requested gain for each stage is applied to a Gain Table that maps the requested gain into gain control bits that produce the requested gain as closely as possible. Thus, each of the gain adjust logic circuits 729, 739, and 749 include a respective part of a Gain Table.

The previous paragraph assumes that the "existing gain" was available. In one embodiment, the relationship of gain control bits to gain is implemented by the "Offset Tables" whose input is the AGC controller 523's record of the radio's current gain control bits, and its output is the current radio gain due to these gain control bits.

Due to the relatively short time available for AGC, it is desirable to use each section's corrected/averaged RSSI measurement to update the gain control bits for multiple selected sections of the receive path, not just the section whose average RSSI is obtained. For example, the RSSI-IF_dBm measure can change the RF-IF gain control bits such that the RF-IF gain is optimized and the BB-IF gain control bits are to be approximately optimized. However, using this same example, changing the RF-IF gain control bits causes the levels of signals into the IF-BB and BB-IQ sections to change. We call this the "knock-on effect" of one section onto its downstream sections.

In one embodiment, the knock-on effect of one section onto its downstream sections is taken into account by the gain change being subtracted from the respective downstream sections' requested gains. Thus, the IF gain-adjust logic 729 is coupled to the BB-IQ gain-adjust logic 739, which in turn is coupled to the IQ gain-adjust logic 749. The gain change from one section to the next is estimated as the change in the Offset Table output when its input is the current and next set of gain control bits.

In one embodiment, the selection of which sections to update is governed by a set of configuration bits. For each AGC stage, the gain control bits of each section may either be left unchanged, forced to a particular value, or, as described above, updated according to the respective average RSSI measurements.

Figure 8:
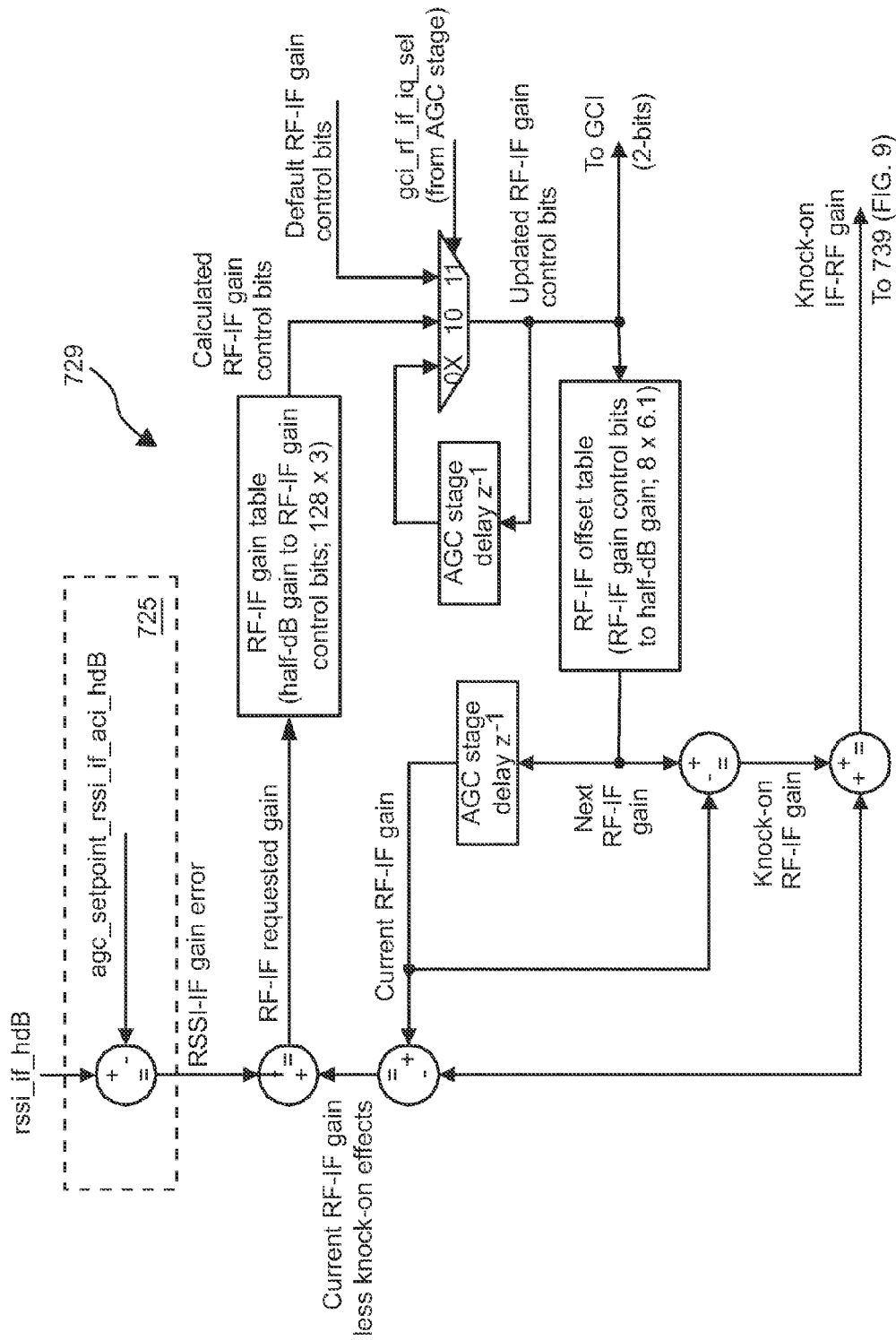
FIGS. 8, 9, and 10 show in simplified block diagram form the details of embodiments of the gain calculations for the RF-IF, IF-BB, and BB-IQ sections, respectively of the receive signal path. Each of these drawings also shows the default gain adjustment, calculation of the knock-on gains, and how the knock-on gain of a preceding stage is used in a follow-on stage.
Figure 9:
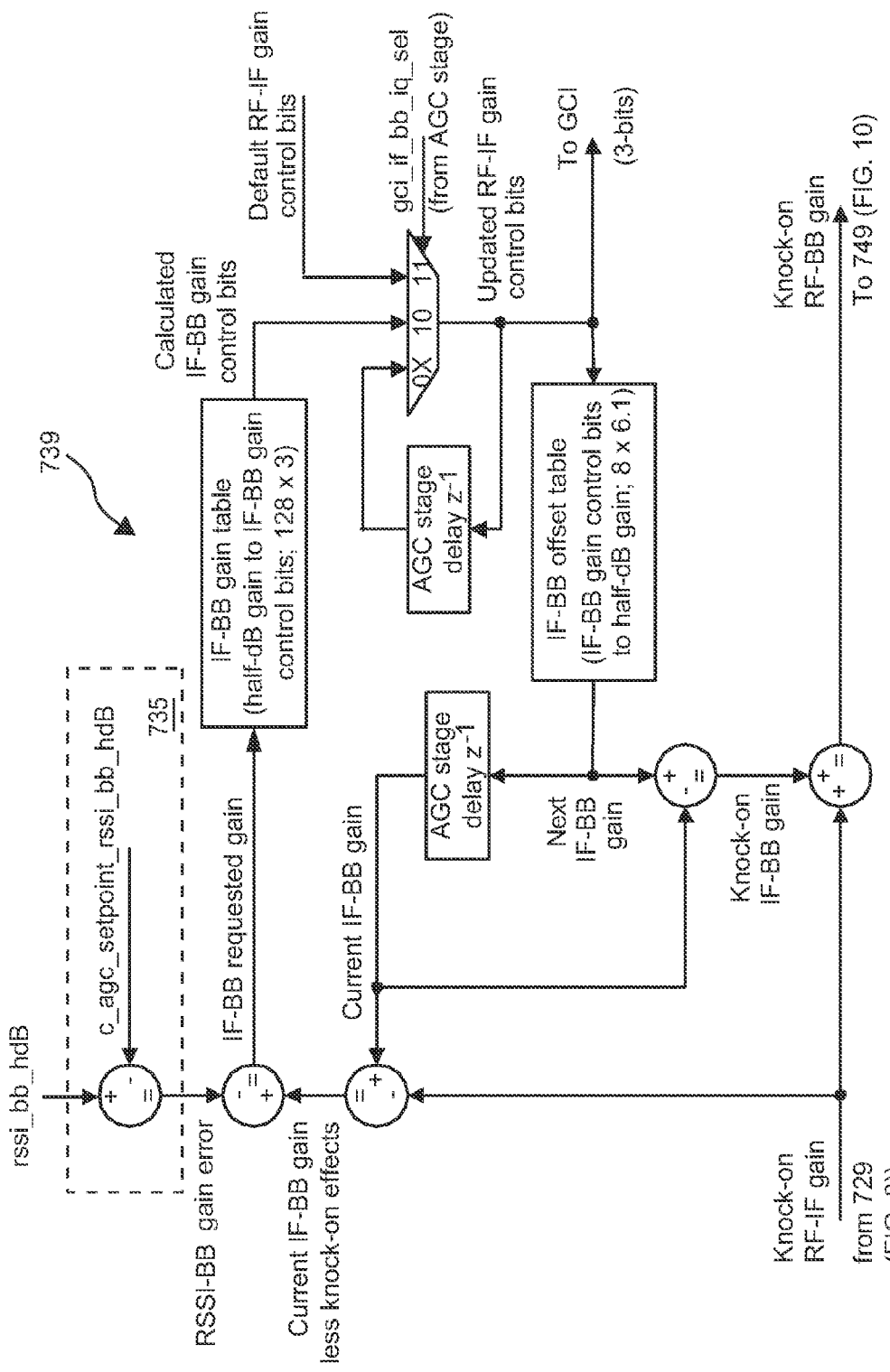
Figure 10:
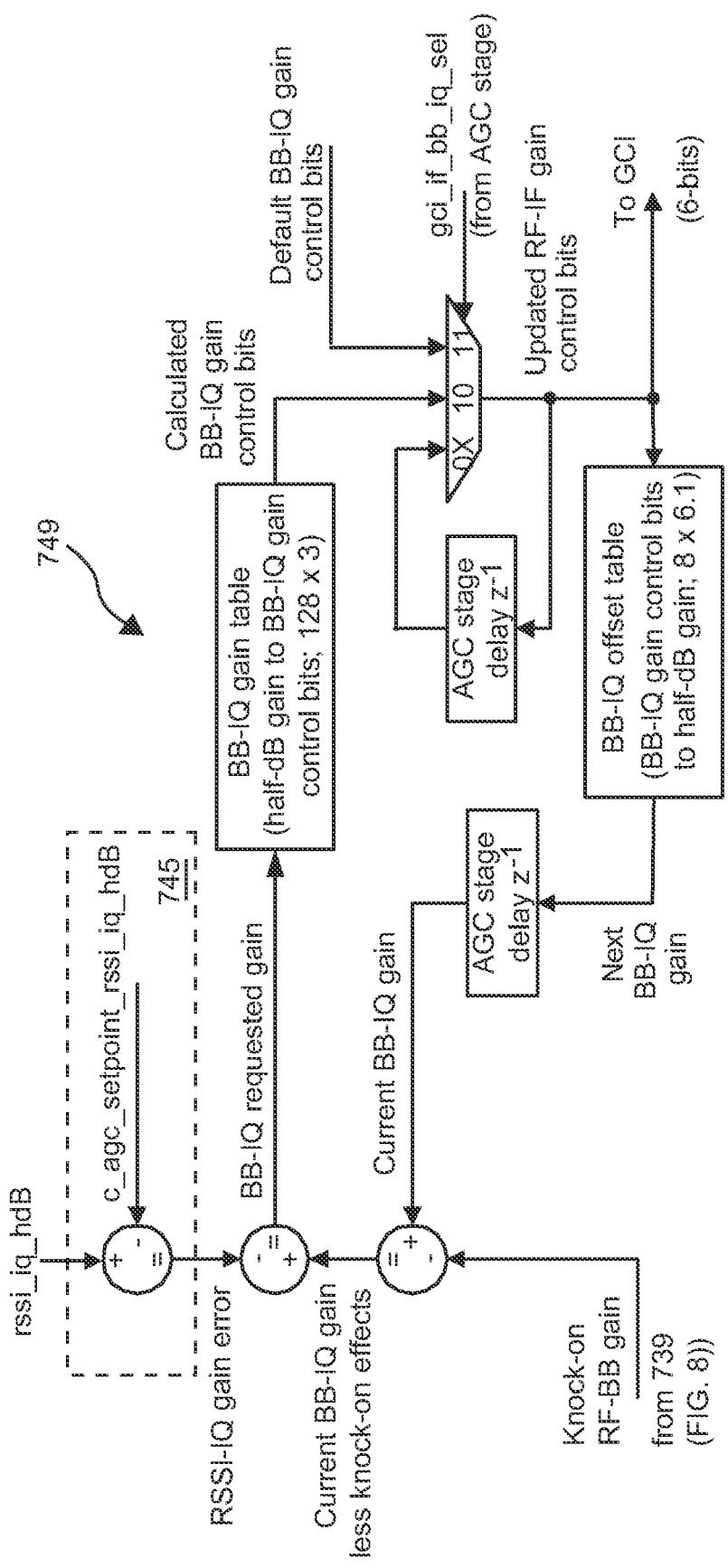

FIGS. 8, 9, and 10 show in simplified block diagram form the details of embodiments of the gain calculations, i.e., blocks 729, 739, and 749, respectively of FIG. 7, for the RF-IF, IF-BB, and BB-IQ sections, respectively of the receive signal path. Each of these drawings also shows the default gain adjustment, calculation of the knock-on gains, and how the knock-on gain of a preceding stage is used in a follow-on stage.

While the above describes operation with a superheterodyne receiver such as shown in the transceiver 400, the invention is also applicable to other architectures, e.g., to a direct conversion receiver such as shown in FIG. 3. In such a case, the number of AGC stages may differ from that for a superheterodyne receiver. One embodiment includes a first stage based mostly on the RSSI-PRE measurement, and a second stage based on also including the RSSI-POST measurement, and yet a third stage based on including RSSI-IQ measurements from the digital signals after the ADCs 313, 315. The first two stages bring the I,Q signals to be digitized within the range of the ADCs 313, 315, and provide for finer control.

Another aspect of the invention is AGC with diversity selection. Diversity selection significantly improves robustness in multipath environments, where commonly the signal from one antenna may be faded yet the other antenna's signal may not be. Diversity selection compares the two signals from a pair of antennas and selects the antenna with the better signal. Due to the very short 802.11a preamble, the AGC controller 523 implements a relatively simple method for diversity selection.

Referring to the state-transition diagram of FIG. 6, when diversity is selected, the AGC controller 523 in the Armed state 603 dwells on one antenna until a packet is detected by SOP detector 522. In order that the AGC controller 523 initially dwells on the likely better antenna, the initial dwell antenna can be set to be the last transmit antenna or the better antenna from the last receive.

Once a packet is detected, in the Measure state 605, the average RSSI-IF, RSSI-BB and RSSI-IQ are measured and recorded for possible use in the Calc state 609. If the recorded RSSI-IQ power is weak, it is assumed that the RF-IF gain does not need to be changed. This assumes that the default gain setting sets the RF-IF gain high. If the packet is indeed weak and if diversity selection enabled, diversity selection is performed instead of the first (RF-IF) AGC stage's Calc, by the AGC controller entering a state called the Antenna settle state 607 that includes switching the selected antenna from the first antenna to a second antenna. Because this may cause a transient, and there may be a delay before that the first antenna's output is not longer reflected in the ADC output, the Antenna settle state is a wait state that waits for a settable amount of time, e.g., 200 ns.

Once the wait state 607 is over, the next state is another measure state called he Antenna measure state 608 in which the average RSSI-IF, RSSI-BB and RSSI-IQ are measured with the second antenna and recorded. The RSSI-IQ measurement duration is settable to be the same as the first antenna's measurement duration, e.g., 0.4 µs.

If the first antenna's rssi-iq_hdB is greater than the second antenna's, then the selected antenna is switched back to the first antenna. At the same time the AGC controller moves to the Calc state 609 where calculations are performed using the stored RSSI measurements from this first antenna.

If, instead, the first antenna's rssi-iq_hdB is less than the second antenna's, then the selected antenna is unchanged and the AGC controller moves to the Calc state 609 where calculations are performed using the stored RSSI measurements from this second antenna.

Due to the short 802.11a preamble, there is no time for the two additional states Antenna settle 607 and Antenna measure 608. Therefore, selection diversity replaces one AGC stage. It is for this reason that selection diversity is only implemented for weak packets, since for them the default RF-IF gain control is also the best front-end gain setting. In this way AGC has fewer changes to make so it is acceptable to have fewer AGC stages.

The AGC stage is eliminated by incrementing the AGC stage counter when AGC reaches the Antenna settle state 607. Now the AGC controller 523 never passes through the Calc, Adjust or Settle states in the first AGC stage, nor the Measure state in the second stage.

Thus an AGC method and a receiver having multiple signal strength measurements have been disclosed. The noise performance of such a radio receiver when operating with the AGC method should be significantly improved over one that needs to provide enough room at the front-end for strong interferers whether or not such an interferer is present.

Figure 11:
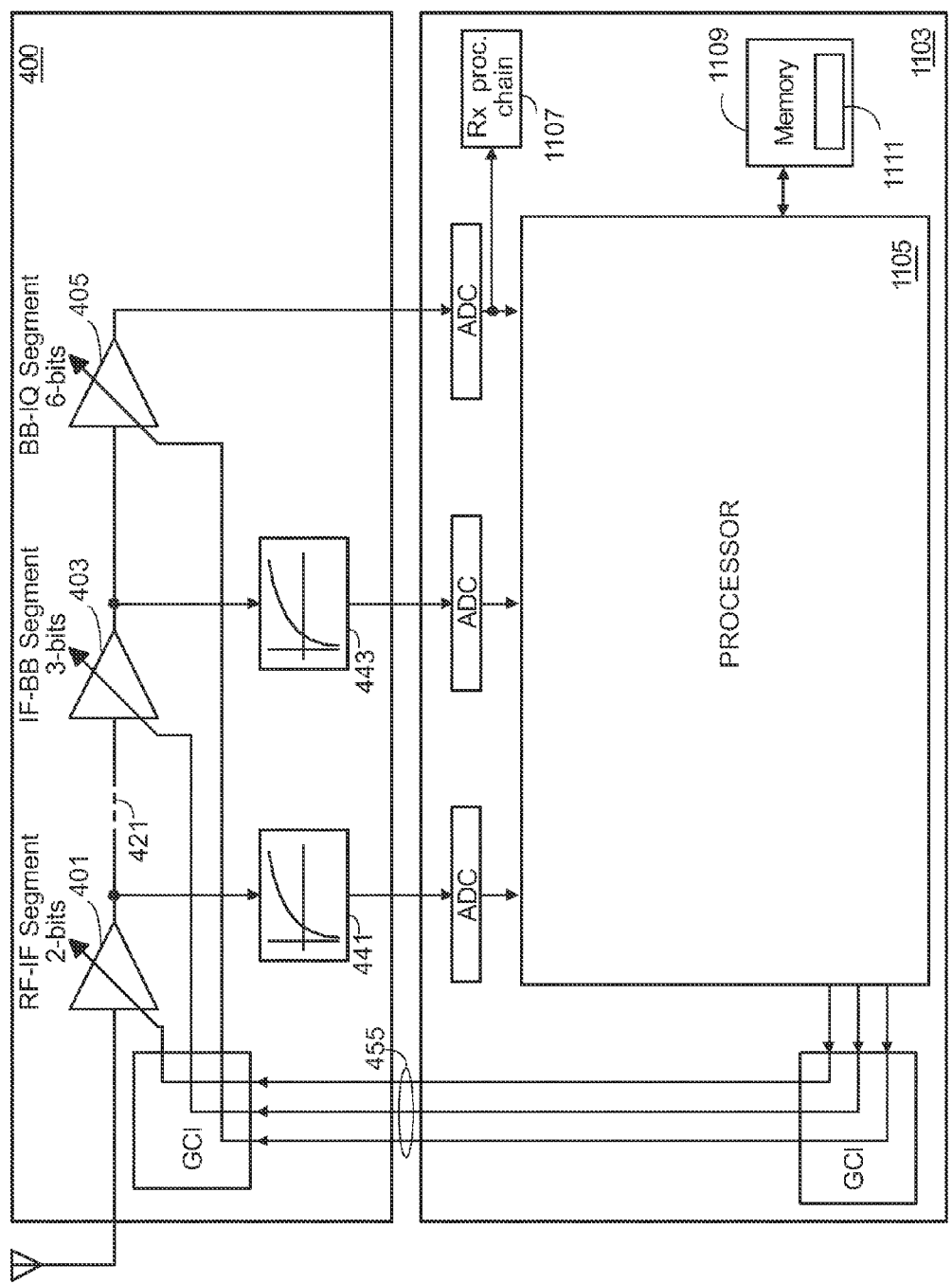
FIG. 11 shows an alternate embodiment of the AGC controller shown in FIG. 7. The AGC controller of FIG. 11 is implemented in a processing system of a modem.

While one AGC controller embodiment described herein uses a finite state machine for operation, another embodiment uses a processing system that includes one or more processors. FIG. 11 shows such a variation of the AGC controller control shown in FIG. 7, i.e., FIG. 11 shows an AGC controller is implemented in a processor 1105 in a modem 1103. The processor 1105 is coupled to a memory 1109. The inventive AGC function is provided as a set of programming instructions 1111 (computer readable code segments) stored in the memory that instruct the processor to implement the AGC method. The processor accepts signals from three ADCs: two RSSI ADCs and a main ADC. For AGC, the processor imple-
ments the method described herein and generates signals, e.g., sets of gain control bits to send to a radio receiver—the radio of transceiver 400 is shown here—via a GCI.

Note that each of FIGS. 2, 3, and 4 shows a simplified block diagram that leaves out various elements that may be present in an actual receiver as would be clear to those in the art. Furthermore, some of the elements may be implemented by several elements. For example, a single VGA 203 is shown in the RF section of the receive signal path. In an actual implementation, the VGA 203 may be implemented by one or more fixed gain low noise amplifiers (LNAs) that may be switched in or out of the receive signal path according to desired gain in the RF section. Any of these LNAs may be external to the receiver integrated circuit. The representation 203 of the RF VGA may further include another fixed gain LNA and an actual VGA. Similarly, there may be further fixed amplification elements in the receiver not shown in FIG. 2.

Note that while FIGS. 4 and 5 show a wireless receiver that is made up of an RF chip and a separate modem chip, the invention is not restricted to such architectures, and may be implemented as a wireless receiver that includes an AGC controller and a receive signal path having at least one filter, a pre-filter section, and post-filter section. The pre-filter and post-filter sections have adjustable gains and provide signal strength measurements. The AGC controller accepts the pre and post-filter signal strength measurements and controls the gains of the sections according to the signal strengths and desired results. The combination may be implemented in a system that is completely analog, or that is part analog and part digital. Furthermore, the combination may be implemented as a single monolithic integrated circuit or as a combination of components, none, some, or all of which may be integrated circuits (chips). For example, the receivers shown in FIG. 2, FIG. 3, FIGS. 4 and 5 in combination, FIG. 7, and FIG. 11 conform to this architecture.

Note that the locations of the signal strength indications may be altered for different embodiments. For example, the embodiment of FIGS. 2 and 4 show the first signal strength detectors to be in the IF section of the receiver. In general, there is a pre-filter signal strength indicator before the filtering, and a post-filter signal strength indicator after the filtering. There is at least one variable gain element prior to any signal strength indicator that effects that signal strength and not the follow-on signal strength. Thus, as an example, an alternate embodiment may include a variable gain LNA in the RF part, a first (pre-filter) RSSI detector in the IF prior to any IF VGA and IF filter, an IF filter followed by an IF VGA, then a second (post-filter) RSSI detector after the IF VGA, but still in the IF section. Many other variations are possible as would be clear to those in the art.

While embodiments that use analog RSSI detectors that provide measures in a logarithmic scale, alternate embodiments may include ADCs that convert signals at desired (pre filter and post-filter) points in the receive signal path, with any conversion to signal strength indications, e.g., in a log scale occurring digitally.

While an embodiment has been described for operation with a WLAN receiver with RF frequencies in the 5 GHz range and 2.4 GHz range (the 802.11a, b and g variants of the IEEE 802.11 standard), the invention may be embodied in receivers and transceivers operating in other RF frequency ranges, and in an AGC method or apparatus therefor. Furthermore, while a receiver embodiment for operation conforming to the IEEE 802.11 OFDM standards has been described, the invention may be embodied in receivers conforming to other standards and for other applications, including, for example other WLAN standards and other wireless standards. Applications that can be accommodated include IEEE 802.11 wireless LANs and links, wireless Ethernet, HIPERLAN 2, European Technical Standards Institute (ETSI) broadband radio access network (BRAN), and multimedia mobile access communication (MMAC) systems, wireless local area networks, local multipoint distribution service (LMDS) IF strips, wireless digital video, wireless USB links, wireless IEEE 1394 links, TDMA packet radios, low-cost point-to-point links, voice-over-IP portable "cell phones" (wireless Internet telephones), etc.

One embodiment of each of the AGC methods described herein is in the form of a computer program that executes on a processing system, e.g., one or more processors that are part of a modem. Thus, as will be appreciated by those skilled in the art, embodiments of the present invention may be embodied as a method, an apparatus such as a special purpose apparatus, an apparatus such as a data processing system, or a carrier medium, e.g., a computer program product. The carrier medium carries one or more computer readable code segments for controlling a processing system to implement a method. Accordingly, aspects of the present invention may take the form of a method, an entirely hardware embodiment, an entirely software embodiment or an embodiment combining software and hardware aspects. Furthermore, the present invention may take the form of carrier medium (e.g., a computer program product on a computer-readable storage medium) carrying computer-readable program code segments embodied in the medium. Any suitable computer-readable medium may be used including a magnetic storage device such as a diskette or a hard disk, or an optical storage device such as a CD-ROM.

It will be understood that the steps of methods discussed are performed in one embodiment by an appropriate processor (or processors) of a processing (i.e., computer) system executing instructions (code segments) stored in storage. It will also be understood that the invention is not limited to any particular implementation or programming technique and that the invention may be implemented using any appropriate techniques for implementing the functionality described herein. The invention is not limited to any particular programming language or operating system.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner, as would be apparent to one of ordinary skill in the art from this disclosure, in one or more embodiments.

Similarly, it should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

All publications, patents, and patent applications cited herein are hereby incorporated by reference.

Thus, while there has been described what is believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

We claim:

1. A radio receiver comprising:
a receive signal path including:
a filter;
a pre-filter section prior to the filter, the pre-filter section including at least one adjustable gain element configured to provide an adjustable gain to the pre-filter section;
at least two post-filter sections after the filter, including a first post filter section immediately after the filter, the post-filter sections each including at least one adjustable gain element configured to provide an adjustable gain to the post-filter section;
a pre-filter signal strength detector coupled to the pre-filter section configured to measure the relative strength of the signal at a point in the receive signal path prior to filtering by the filter, the pre-filter signal strength detector having an output coupled to a first analog-to-digital converter and a first calibrator configured to provide a first multi-bit calibrated measure of the relative strength of the signal at the prior-to-filtering point;
a first post-filter signal strength detector coupled to the first -post-filter section configured to provide a measure of the relative strength of the signal at a first post-filtering point in the receive signal path after filtering by the filter, the first post-filter signal strength detector having an output coupled to a second analog-to-digital converter and a second calibrator configured to provide a second multi-bit calibrated measure of the relative strength of the signal at the first post-filtering point;
an automatic gain controller (AGC controller) coupled to the outputs of first and second calibrators of the pre-filter and first post-filter signal strength detectors and further coupled to the variable gain elements configured to set the gains of the respective sections according to the pre-filter and first post-filter multi-bit calibrated signal strength measures, the setting being configured to respectively set the pre-filter signal strength and the first post-filter signal strength to a desired pre-filter signal power and a desired first post-filter signal power, respectively, the gains setting providing an overall gain setting for the receive path, the AGC controller further configured to determine respective averages of the pre-filter and first post filter multi-bit calibrated signal strength measures, to compare the pre-filter and of the first post-filter averaged multi-bit calibrated signal strength measures to respective pre-filter and first post-filter desired signal powers, and to adjust the gains of the respective pre-filter and of the first post-filter sections to reduce the differences between the averaged signal strength measures and desired signal powers; and
a main multi-bit analog to digital converter (ADC) configured to convert the output of the last analog section in the receiver signal path to a digital output signal, the multi-bit ADC having an operating range for its input, such that the gain settings of the pre-filter and first post filter variable gain elements adapt to achieve the desired pre-filter and post-filter signal powers according to the signal characteristics, and take into account the amount of filtering provided by the filter, and such that the gain settings of the pre-filter and first post filter variable gain elements does not require use of the digital output signal of the multi-bit ADC, and such that at least the first stage is configured to bring the input of the ADC to within the operating range of the ADC, such that the gain setting of at least the last post-filter stage uses the output of the multi-bit ADC.

2. A receiver as recited in claim 1, wherein the AGC controller is further configured to correct each of the pre-filter and first post-filter signal strength indications so that the averages are corrected averages.

3. A receiver as recited in claim 2, wherein the correction of the pre-filter and first post-filter signal strength indications is in order to bring the indications to a common scale so that the indications may be compared, and wherein the adjusting of the gains of at least one of the sections depends on both the pre-filter and first post-filter corrected and averaged signal strength indications.

4. A receiver as recited in claim 2, wherein the AGC controller operates in sequential stages, each stage configured to set the gains of one or more sections to achieve desired signal strength levels including the desired pre-filter signal strength level and a desired post-filter signal strength levels, the adjustment of each section being by a variable amount that depends on the calibrated measures of the relative strength.

5. A receiver as recited in claim 4, wherein a first stage is configured to set the gain of the pre-filter section according to the pre-filter signal strength indication and to set the gain of the first post filter section according to both the pre-filter signal strength indication and the first post-filter signal strength indication, and other stages are configured to finalize the gain setting of any other post-filter sections, according to additional signal strength indications from the relevant sections.

6. A receiver as recited in claim 1, wherein the receive signal path includes an RF section operating at RF and an intermediate frequency IF section after the RF section operating at an intermediate frequency, and wherein the filter is in the intermediate frequency section of the receive signal path.

7. A receiver as recited in claim 6, wherein the signal path includes a second filter section including a second filter between any variable gain element in the first post-filter section and any variable gain element in the second post-filter section, such that the gain setting takes into account the amount of filtering by the second filter in addition to the amount of filtering by the first filter.

8. A receiver as recited in claim 1, wherein the desired pre-filter signal power and a desired post-filter signal power are selected in order to maximize the signal-to-noise-and-distortion at the end of the respective sections.

9. A receiver as recited in claim 5,
wherein the first post-filter signal strength detector is coupled to the first pre-filter section, and
wherein at least the first stage is configured to set the gain of the pre-filter section and first post filter section to bring the input of the multi-bit ADC to within the range of the ADC.

10. A method for controlling the gain of a radio receiver, the receiver having a receive signal path including
a filter;
a pre-filter section prior to the filter, the pre-filter section including at least one adjustable gain element configured to provide an adjustable gain to the pre-filter section; and
at least two post-filter sections after the filter, including a first post filter section immediately after the filter, the post-filter sections each including at least one adjustable gain element configured to provide an adjustable gain to the respective post-filter section;
the method comprising:
accepting a first multi-bit calibrated measure of the pre-filter relative signal strength at a point in the receive signal path prior to filtering by the filter;
accepting a second multi-bit calibrated measure of the post-filter relative signal strength at a first post-filtering point in the receive signal path after the filtering by the filter;
determining respective averages of the first multi-bit calibrated measure and the second multi-bit calibrated measure;
comparing the respective averages of the first and second multi-bit calibrated signal strength measures to a desired pre-filter signal power and a desired post-filter signal power;
setting the gains of the respective sections to reduce the differences between the average first and second multi-bit calibrated signal strength measure and the desired pre-filter and desired post filter signal powers, respectively, the gain setting providing an overall gain setting for the receive signal path;
analog to digital converting the output of the last analog section in the receiver signal path to a digital output signal using a multi-bit analog-to-digital converter (ADC) that has an operating range for its input,
such that the gain settings of the pre-filter and post filter variable gain elements adapt to achieve the desired pre-filter and post-filter signal powers according to the signal characteristics, and take into account for the amount of filtering provided by the filter,
such that the gain setting of the pre-filter and first post filter variable gain elements are configured to set the output of the last analog section in the receiver signal path to be within the operating range of the multi-bit ADC, and does not require use of the digital output signal from the converting, and
such that the gain adjusting of any section subsequent to the first post filter section is based on the digital output signal from the analog to digital converting.

11. A method as recited in claim 10, wherein the accepting of the measures includes calibrating the pre and first post-filter signal strength measures so that they may be compared.

12. A method for controlling the gain of a radio receiver for receiving packets of information, the receiver connected to an antenna subsystem, the receiver including a receive signal path including a plurality of sections including a first section coupled to the antenna subsystem, a next section, and a multi-bit analog-to-digital converter (ADC) coupled to the output of the last analog section in the receiver signal path to output a digital output signal, the multi-bit ADC having an operating range for its input, each section having an adjustable gain, each section able to provide a multi-bit calibrated measure of the signal strength at its output; the method comprising:

waiting for a start of packet indication;
providing multi-bit calibrated measures of the signal strengths at the outputs of the first and the next sections; and
adjusting the gains of the first and the next sections using the provided measures of signal strength, the adjusting being to respectively set the signal strength at respective outputs of the sections to respective desired levels, in order to set the overall gain of the receive signal path and in one or more early stages to cause the output of the last analog section in the receiver signal path to be within the operating range of the multi-bit ADC,
such that the gain adjusting of at least the first section does not require use of the digital output signal from the multi-bit ADC and brings the input of the multi-bit ADC to within the multi-bit ADC's operating range, and the gain adjusting of at least one subsequent section is based on the multi-bit digital output signal from the multi-bit ADC.

13. A method as recited in claim 12, further comprising setting the gains of the sections to a default level prior to waiting for a start of packet indication.

14. A method as recited in claim 12,
wherein the receiver includes a filter in the receive signal path, the providing a measure of the signal strength at the output of the first section being at a point before the filter, and the providing a measure of the signal strength at the output of the next section being at a point after the filtering, the method further comprising:
correcting the provided measures of signal strength at the outputs of the first section and next section to determine measures on a common scale such that the corrected measures may be compared,
wherein the gain adjusting adjusts at least one of the first or next section's gain according to both the provided measure of signal strength at the output of the first section and at the output of the next section.

15. A method as recited in claim 12, wherein the desired levels are selected in order to maximize the signal-to-noise-and-distortion at the end of the respective stages.

16. An AGC controller configured to control the gain of a radio receiver for receiving packets of information, the receiver including:
a receive signal path including a plurality of sections, each section having an adjustable gain, the plurality of sections including a first section coupled to an antenna subsystem and a next section;
a multi-bit analog-to-digital converter (ADC) coupled to the output of the last analog section in the receiver signal path and configured to output a digital output signal, the multi-bit ADC having an operating range for its input; and
a signal strength measurer coupled to each section configured to provide a multi-bit measure of the signal strength at the section's output;
the AGC controller being configured to:
wait for a start of packet indication; and
accept multi-bit measures of the signal strengths from the signal strength measurers at the outputs of the first and next sections; and
adjust the gains of the first and the next sections using the accepted measures of signal strengths, the adjusting being to respectively set the signal strength at respective outputs of the sections to respective desired levels, in order to set the overall gain of the receive signal path and in one or more early stages to cause the output of the last analog section in the receiver signal path to be within the operating range of the multi-bit ADC,
the gain adjusting of at least the first section not using the digital output signal from the multi-bit ADC, and causing the output of the last analog section to be within the operating range of the multi-bit ADC, and
wherein the gain adjusting of at least the last analog section is based on the digital output signal from the multi-bit ADC.

17. An AGC controller as recited in claim 16, wherein the receiver includes a filter in the receive signal path, the signal strength measurer of the first section provides a measure of the signal strength at a point before the filter, and the signal strength measurer of the next section provides a measure of the signal strength at a point after the filter, such that the gain adjusting sets the first section's gain according to the accepted measure of signal strength at the output of the first section and sets the next section's gain according to the accepted measure of signal strength at the output of the next section relative to the accepted measure of signal strength at the output of the first section.

18. An apparatus for controlling the gain of a radio receiver for receiving packets of information, the receiver including:
a receive signal path including a plurality of sections, each section including means to control the section's gain;
means for analog-to-digital converting coupled to the output of the last analog section in the receiver signal path to output a multi-bit digital output signal, the means for analog-to-digital converting having input and an operating range for the input; and
means for measuring a multi-bit measure of the signal strength at the section's output;
the apparatus comprising:
means for waiting for a start of packet indication; and
means for carrying out a plurality of sequential AGC stages, each stage corresponding to adjusting the gain of one or more sections, the means for carrying out a sequential AGC stage including for each stage and corresponding sections:
means for receiving multi-bit measures of the signal strengths at the end of the corresponding sections;
means for comparing the measured signal strengths at the ends of the corresponding sections to respective desired signal strength levels for the respective corresponding sections, the means for comparing the measure at the end of the first section including means for averaging, such that the comparing for the first section is of an average of the measured signal strength at the end of the first section to a first section desired signal strength level; and
means for adjusting the gains of the corresponding sections by a variable amount that depends on the differences between the respective desired levels and the respective measured signal strengths for the corresponding sections,
such that during the first stage of the plurality of sequential AGC stages, the means for adjusting the gains is configured to adjust the gain of at least the first section without requiring use of the digital output signal to bring the input of the means for analog-to-digital converting to within the operating range of the means for analog-to-digital converting,
wherein the means for adjusting the gain of at least the last analog section adjusts the gain based on the output of the means for analog-to-digital converting.

19. An apparatus as recited in claim 18, wherein the receiver includes a filter in the receive signal path, the means for measuring at the end of the first section being at a point before the filter, and the means for measuring at the end of the second section being at a point after the- filter.

20. A computer readable hardware storage medium configured with one or more computer readable instructions that when executed by one or more processors of a processing system carry out a method for controlling the gain of a radio receiver for receiving packets of information, the receiver including a receive signal path including a plurality of sections and a multi-bit analog-to-digital converter (ADC) coupled to the output of the last analog section in the receiver signal path to output a digital output signal, each section having an adjustable gain, each section providing a measure of the signal strength at its output; the method comprising:
   waiting for a start of packet indication; and
   carrying out a plurality of AGC stages, each stage corresponding to one or more sections, including for each stage and corresponding sections:
      measuring the signal strengths at the ends of the corresponding sections to provide multi-bit calibrated signal strengths;
      comparing the measured signal strengths at the ends of the corresponding sections to a respective desired signal strength levels for the corresponding sections; and
      adjusting the gains of the corresponding sections according to the differences between the respective desired levels and the respective measured signal strengths for the corresponding sections, the adjusting being to respectively set the signal strength at respective outputs of the sections to respective desired levels, in order to set the overall gain of the receive signal path and in one or more early stages to cause the output of the last analog section in the receiver signal path to be within the operating range of the multi-bit ADC,
   such that the gain adjusting of at least the first section does not require use of the digital output signal from the multi-bit ADC and causes the output of the last analog section to be within the operating range of the multi-bit ADC, and such that the gain adjusting of at least the last analog section is based on the digital output from the multi-bit ADC.

21. A computer readable hardware storage medium as recited in claim 20, wherein the receiver includes a filter in the receive signal path, the measuring at the first stage being at a point before the filter, and the measuring at the second AGC stage being at a point after the filtering.

* * * * *

UNITED STATES PATENT AND TRADEMARK OFFICE
CERTIFICATE OF CORRECTION

PATENT NO. : 7,668,523 B2
APPLICATION NO. : 11/672132
DATED : February 23, 2010
INVENTOR(S) : Adams et al.

It is certified that error appears in the above-identified patent and that said Letters Patent is hereby corrected as shown below:

In Column 3, line 42, kindly replace "modern" with --modem--

In Column 4, line 17, kindly replace "GHz" with --MHz--

In Column 7, line 65, kindly replace "G-rx_rf-if lna" with --G_rx_rf_if_lna--

In Column 8, line 5, kindly replace "GHz" with --MHz--

In Column 8, line 14, kindly replace "750 GHz" with --750 Mhz--

In Column 8, line 20, kindly replace "on20" with --on 20--

In Column 8, line 39, kindly replace "770 GHz" with --770 Mhz--

In Column 8, line 46, kindly replace "say N" with --say *N*--

In Column 8, line 54, kindly replace "word-for" with --word—for--

In Column 11, line 2, kindly replace "6 ps" with --6 μs--

In Column 13, line 20, kindly replace
"ACI_dB = max(RSSI_IF_dBm_RSSI_BB_dBm,0)"
with --ACI_dB = max(RSSI_IF_dBm − RSSI_BB_dBm,0)--

In Column 13, line 31, kindly replace "agc_setpoint_rssi if_aci_hdB"
with --agc_setpoint_rssi_if_aci_hdB--

Signed and Sealed this

Twenty-ninth Day of June, 2010

David J. Kappos
*Director of the United States Patent and Trademark Office*